(12) United States Patent
Hu et al.

(10) Patent No.: US 10,707,084 B2
(45) Date of Patent: Jul. 7, 2020

(54) METHOD OF MANUFACTURING WAFER LEVEL CHIP SCALE PACKAGE

(71) Applicant: TAIWAN SEMICONDUCTOR MANUFACTURING COMPANY LTD, Hsinchu (TW)

(72) Inventors: Yu-Hsiang Hu, Hsinchu (TW); Wei-Yu Chen, Taipei (TW); Hung-Jui Kuo, Hsinchu (TW); Wei-Hung Lin, Hsinchu (TW); Ming-Da Cheng, Hsinchu (TW); Chung-Shi Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 33 days.

(21) Appl. No.: 15/830,621

(22) Filed: Dec. 4, 2017

(65) Prior Publication Data

US 2018/0090331 A1     Mar. 29, 2018

Related U.S. Application Data

(62) Division of application No. 14/192,374, filed on Feb. 27, 2014, now Pat. No. 9,837,278.

(51) Int. Cl.
*H01L 21/304* (2006.01)
*H01L 25/07* (2006.01)
(Continued)

(52) U.S. Cl.
CPC .......... *H01L 21/304* (2013.01); *H01L 23/147* (2013.01); *H01L 23/15* (2013.01); *H01L 23/3121* (2013.01); *H01L 23/3157* (2013.01); *H01L 23/3185* (2013.01); *H01L 23/3192* (2013.01); *H01L 24/19* (2013.01); *H01L 24/20* (2013.01); *H01L 25/0655* (2013.01); *H01L 25/072* (2013.01); *H01L 21/561* (2013.01); *H01L 2224/04105* (2013.01);
(Continued)

(58) Field of Classification Search
CPC ................. H01L 21/304; H01L 21/561; H01L 2224/92244; H01L 2224/04105; H01L 23/3121; H01L 23/3157; H01L 23/3192; H01L 25/0655; H01L 25/072
See application file for complete search history.

(56) References Cited

U.S. PATENT DOCUMENTS 5,353,498 A * 10/1994 Fillion .................. H01L 21/568
257/E21.505
6,987,068 B2 * 1/2006 Friis .................... H01L 21/3086
257/E21.038
(Continued)

*Primary Examiner* — Tuan A Hoang
(74) *Attorney, Agent, or Firm* — WPAT, P.C., Intellectual Property Attorneys; Anthony King

(57) ABSTRACT

A method of manufacturing a semiconductor device includes receiving a die including a top surface, a die pad exposed from the top surface, and sacrificial layer covering the top surface and the die pad; disposing the die on a substrate, disposing a molding surrounding the die and covering the sacrificial layer; removing a first portion of the molding and a portion of the sacrificial layer to expose a top surface of the sacrificial layer; removing a second portion of the molding to expose a sidewall of the sacrificial layer; and removing the sacrificial layer from the die.

20 Claims, 21 Drawing Sheets

(51) Int. Cl.
 *H01L 23/31* (2006.01)
 *H01L 23/14* (2006.01)
 *H01L 23/15* (2006.01)
 *H01L 25/065* (2006.01)
 *H01L 23/00* (2006.01)
 *H01L 21/56* (2006.01)

(52) U.S. Cl.
 CPC . *H01L 2224/11* (2013.01); *H01L 2224/12105* (2013.01); *H01L 2224/16227* (2013.01); *H01L 2224/32225* (2013.01); *H01L 2224/73267* (2013.01); *H01L 2224/92244* (2013.01)

(56) References Cited

U.S. PATENT DOCUMENTS

| | | | | |
|---|---|---|---|---|
| 2004/0056344 | A1* | 3/2004 | Ogawa | H01L 21/6835 257/686 |
| 2010/0109169 | A1* | 5/2010 | Kolan | H01L 21/486 257/787 |
| 2011/0272800 | A1* | 11/2011 | Chino | H01L 21/561 257/737 |
| 2013/0009316 | A1* | 1/2013 | Wang | H01L 25/0655 257/774 |
| 2014/0048959 | A1* | 2/2014 | Hu | H01L 24/24 257/782 |
| 2014/0061891 | A1* | 3/2014 | Kim | H01L 23/3121 257/704 |
| 2016/0272737 | A1* | 9/2016 | Ibe | C08F 12/32 |
| 2016/0367985 | A1* | 12/2016 | Delamarche | B01L 3/502707 |

\* cited by examiner

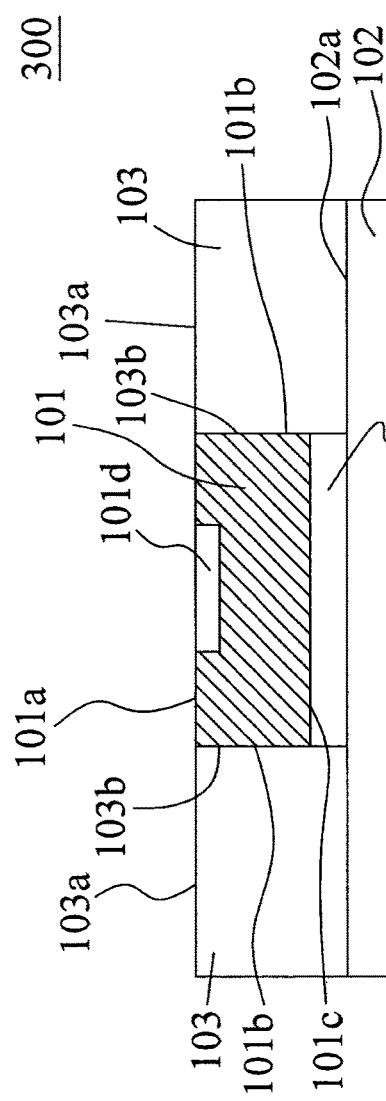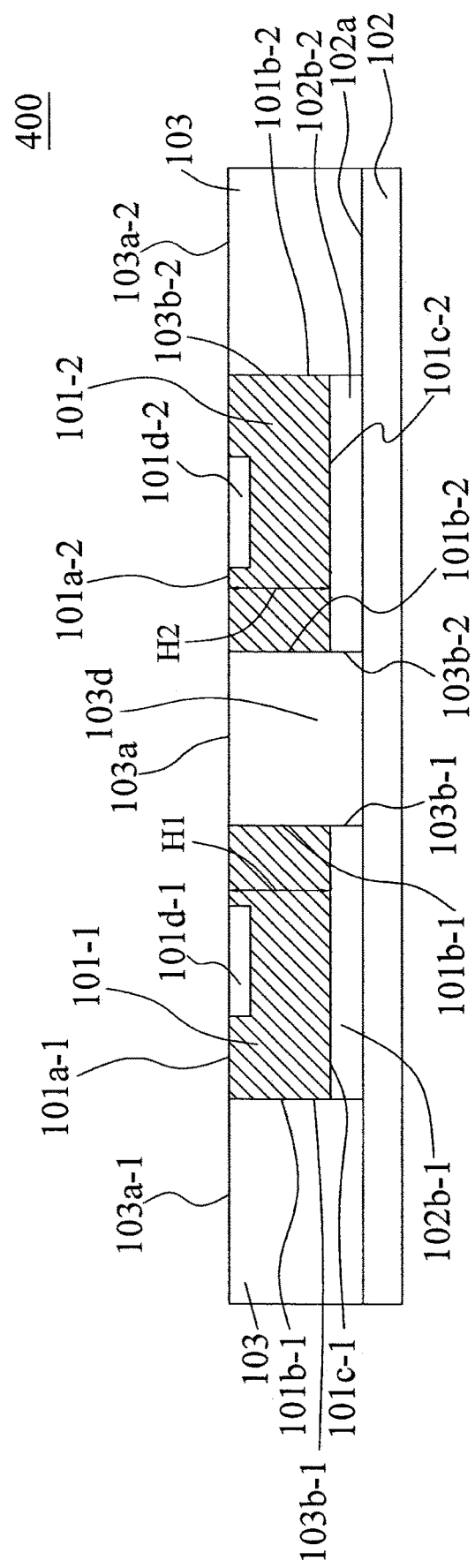
FIG. 3
FIG. 4

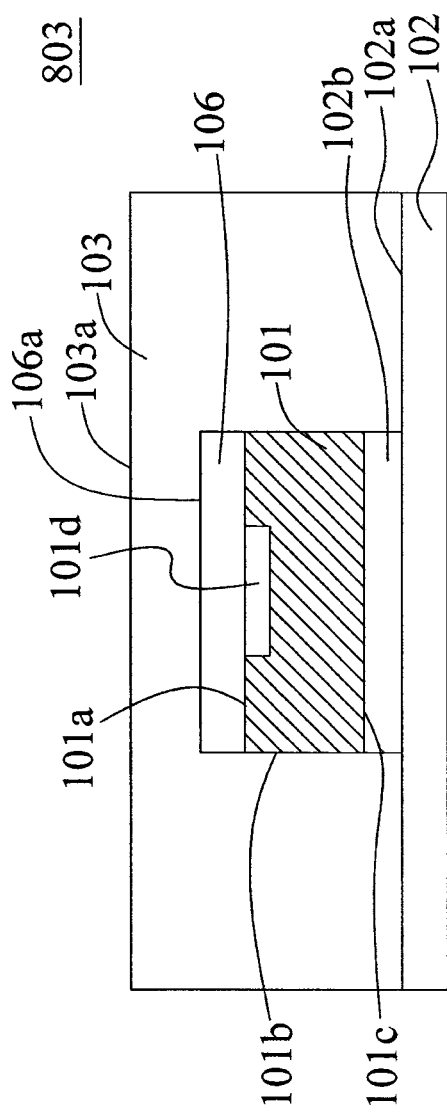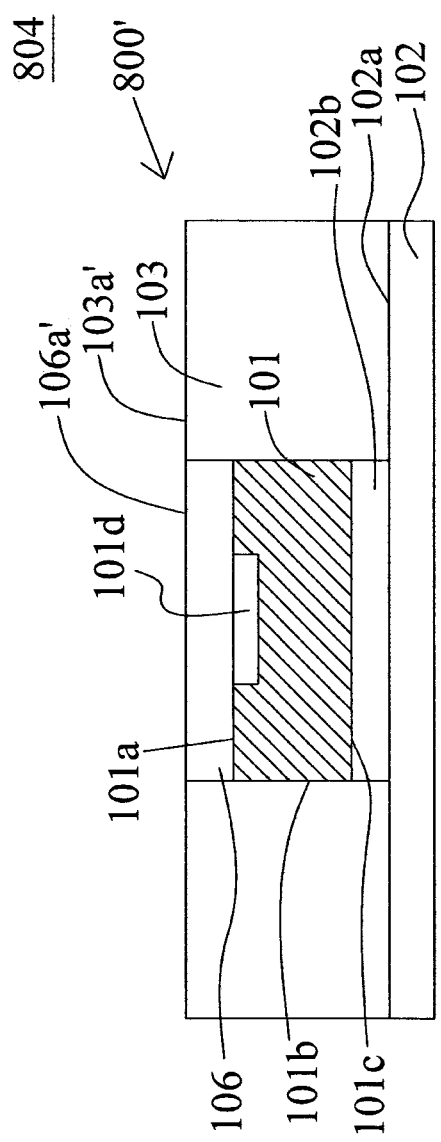
FIG. 8C
FIG. 8D

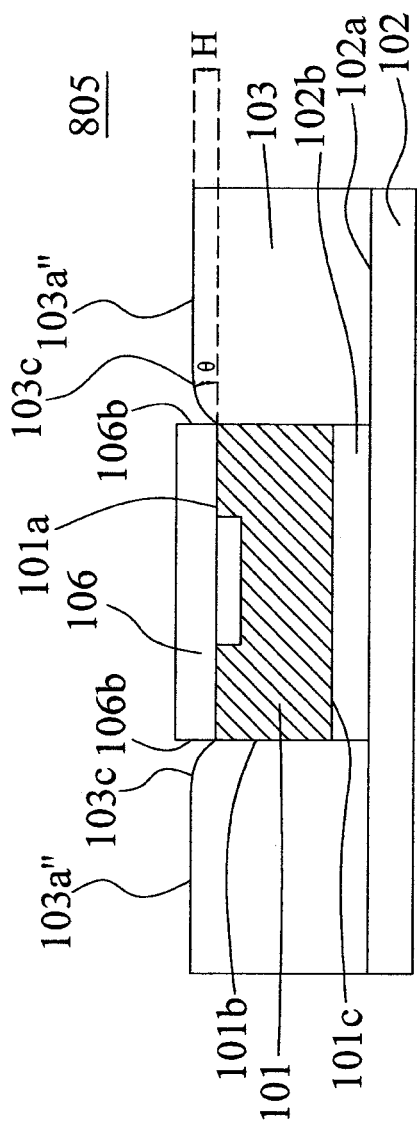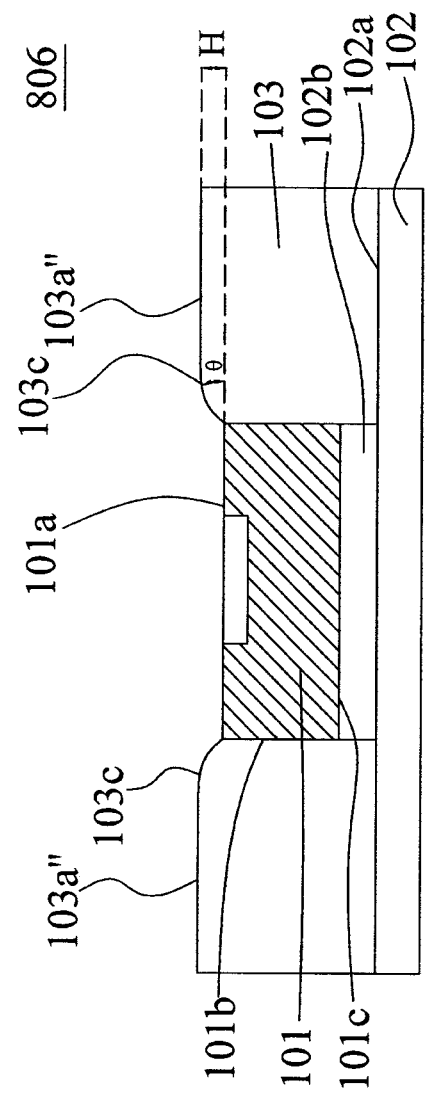

METHOD OF MANUFACTURING WAFER LEVEL CHIP SCALE PACKAGE

PRIORITY CLAIM AND CROSS-REFERENCE

This application is a divisional application of U.S. patent application Ser. No. 14/192,374, entitled "WAFER LEVEL CHIP SCALE PACKAGE AND METHOD OF MANUFACTURING THE SAME" filed on Feb. 27, 2014, the disclosure of which is hereby incorporated by reference in its entirety.

BACKGROUND

Electronic equipment using semiconductor device is essential for many modern applications. With the advancement of electronic technology, electronic equipment is becoming increasingly smaller in size while having greater functionality and greater amounts of integrated circuitry. Thus, manufacturing of the electronic equipment includes more and more steps of assembly and involves various materials for producing the semiconductor device in the electronic equipment. Therefore, there is a continuous demand on simplifying the steps of production, increasing a production efficiency and lowering an associated manufacturing cost on each electronic equipment.

The major trend in the electronic industry is to make the semiconductor device smaller and more multifunctional. The semiconductor device comprises numbers of components overlaying on each other and several electrical interconnection structures for electrically connecting the components between adjacent layers, such that the final size of the semiconductor device as well as the electronic equipment is minimized. However, as different layers and components include different kinds of materials with different thermal properties, the semiconductor device in such configuration would have delamination and bondability issues. The poor bondability between components would lead to delamination of components and yield loss of the semiconductor device. Furthermore, the components of the semiconductor device includes various metallic materials which are in limited quantity and thus in a high cost. The yield loss of the semiconductor would further exacerbate materials wastage and thus the manufacturing cost would increase.

Numerous manufacturing operations are implemented within such a small and high performance semiconductor device. Thus, manufacturing the semiconductor device in a miniaturized scale becomes more complicated. An increase in a complexity of manufacturing the semiconductor device may cause deficiencies such as poor reliability of the electrical interconnection, development of cracks within components and delamination of layers. Thus, there is a continuous need to improve the method for manufacturing the semiconductor device in order to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a schematic view of a semiconductor structure with a die surrounding by a molding surrounding a die in accordance with some embodiments.

FIG. 4 is a schematic view of a semiconductor structure with two dies surrounded by a molding surrounding a die in accordance with some embodiments.

FIG. 8C is a schematic view of a die surrounded by a molding in accordance with some embodiments.

FIG. 8D is a schematic view of a ground molding and a ground sacrificial layer in accordance with some embodiments.

FIG. 8E is a schematic view of a curved surface of a molding in accordance with some embodiments.

FIG. 8F is a schematic view of a die without a sacrificial layer in accordance with some embodiments.

DETAILED DESCRIPTION OF THE DISCLOSURE

Figure 1:
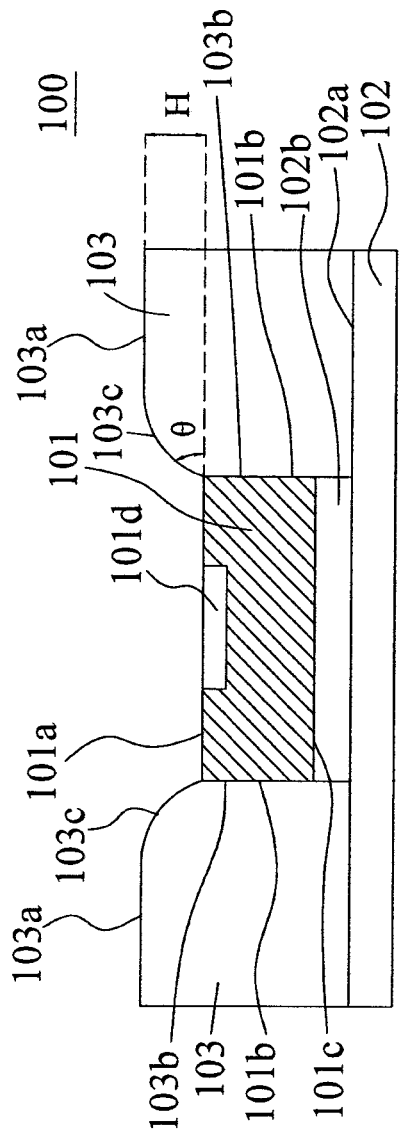
FIG. 1 is a schematic view of a semiconductor structure with a curved surface of a molding surrounding a die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device is manufactured by a number of operations. During the manufacturing, a top surface of a die including several circuits and components is covered by a sacrificial layer, and the die is encapsulated by a molding. As such, the die is protected by the molding and the circuits exposed from the top surface of the die are protected by the sacrificial layer. The sacrificial layer prevents the circuits of the die from damages during grinding of a top surface of the molding. After the grinding of the molding, the sacrificial layer would be removed.

After removing the sacrificial layer from the top surface of the die, there is a stepped portion of the molding adjacent to a periphery of the die. The stepped portion would cause other components subsequently placed over the top surface of the die could not be smoothly disposed thereon, and thus delamination of components is suffered. The formation of the stepped portion of the molding compound leads to a stepping between components and thus induce a poor bondability between components and a poor reliability of the semiconductor device.

In the present disclosure, a semiconductor structure with a structural improvement is disclosed. The semiconductor structure includes a molding with a curved surface adjacent to a periphery of a die. The curved surface is coupled with a top surface of the molding and a sidewall of the molding. As such, the curved surface of the molding smoothen a height difference between the top surface of the molding and a top surface of the die. Thus, a stepping of the molding adjacent to the periphery of the die is mitigated by the curved surface. Therefore, delamination of components is prevented and a reliability of the semiconductor device is improved.

Furthermore, a molding without a stepped portion is also disclosed. A semiconductor structure includes the molding without the stepped portion disposed adjacent to a top surface of a die. The stepped portion is removed by an etching operation, so that the top surface of the die is at a substantially same level as a top surface of the molding. As there is no substantial stepping between the molding and the die, the components subsequently configured over the die and the molding are smoothly disposed. Therefore, a bond ability between components is improved and delamination of components is avoided.

FIG. 1 is a semiconductor structure 100 in accordance with various embodiments of the present disclosure. The semiconductor structure 100 includes a die 101. In some embodiments, the die 101 is a small piece including semiconductor materials such as silicon and is fabricated with a predetermined functional circuit within the die 101 produced by photolithography operations. In some embodiments, the die 101 is singulated from a silicon wafer by a mechanical or laser blade. In some embodiments, the die 101 is in a quadrilateral, a rectangular or a square shape.

In some embodiments, the die 101 includes a top surface 101a, a sidewall 101b and a bottom surface 101c. In some embodiments, the top surface 101a of the die 101 is substantially orthogonal to the sidewall 101b of the die 101. In some embodiments, the top surface 101a is a horizontal plane and the sidewall 101b is a vertical plane.

In some embodiments, the die 101 includes a die pad 101d exposed from the top surface 101a of the die 101. In some embodiments, the die pad 101d is configured for electrically connecting with a circuitry external to the die 101, so that a circuitry internal to the die 101 electrically connects with the circuitry external to the die 101 through the die pad 101d.

In some embodiments, the die pad 101d is configured for electrically coupling with a conductive bump through a redistribution layer (RDL) disposed over the die pad 101d, so that the circuitry internal to the die 101 connects with the circuitry external to the die 101 from the die pad 101d to the conductive bump through the RDL. In some embodiments, the die pad 101d includes gold, silver, copper, nickel, tungsten, aluminum, palladium and/or alloys thereof. In some embodiments, the conductive bump is a solder ball or solder paste.

In some embodiments, the semiconductor structure 100 includes a substrate 102. In some embodiments, the die 101 is disposed on the substrate 102 for subsequent manufacturing operations. In some embodiments, the bottom surface 101c of the die 101 is attached on a surface 102a of the substrate 102 by an adhesive, a tape or die attach film (DAF) 102b etc. In some embodiments, the substrate 102 includes glass, silicon or ceramic.

In some embodiments, the semiconductor structure 100 includes a molding 103. In some embodiments, the molding 103 surrounds the die 101. In some embodiments, the molding 103 is disposed on the surface 102a of the substrate 102. In some embodiments, the molding 103 is disposed adjacent to the sidewall 101b of the die 101. In some embodiments, the molding 103 includes epoxy resins, phenolic hardeners, silicas, catalysts or etc. Material for forming the molding has a high thermal conductivity, a low moisture absorption rate, a high flexural strength at board-mounting temperatures, or a combination of these.

In some embodiments, the molding 103 includes a top surface 103a, a sidewall 103b and a curved surface 103c. In some embodiments, the top surface 103a of the molding 103 is a substantially flat surface parallel to the top surface 101a of the die 101. In some embodiments, the top surface 103a of the molding 103 is coupled with the sidewall 103b of the molding 103 by the curved surface 103c.

In some embodiments, the top surface 103a of the molding 103 is at a level substantially higher than the top surface 101a of the die 101. The top surface 101a of the die 101 is at a level substantially lower than the top surface 103a of the molding 103. In some embodiments, there is a level difference H between the top surface 101a of the die 101 and the top surface 103a of the molding 103. In some embodiments, the level difference H is about 1.5 µm to about 2.5 µm. In some embodiments, the level difference H is less than about 2.2 µm.

In some embodiments, the sidewall 103b of the molding 103 is interfaced with the sidewall 101b of the die 101. In some embodiments, the sidewall 103b of the molding 103 is attached with the sidewall 101b of the die 101. In some embodiments, the sidewall 103b of the molding 103 is substantially orthogonal to the top surface 103a of the molding 103. In some embodiments, the sidewall 103b of the molding 103 is a vertical surface and is substantially parallel to the sidewall 101b of the die 101.

In some embodiments, the curved surface 103c of the molding 103 has a curvature between the top surface 103a and the sidewall 103b of the molding 103. In some embodiments, the curved surface 103c couples the top surface 103a with the sidewall 103b of the molding 103. In some embodiments, the curvature of the curved surface 103c is greater than zero. In some embodiments, the curvature of the curved surface 103c is a reciprocal of about 1.5 µm to about 2.5 µm. In some embodiments, the curvature of the curved surface 103c is a reciprocal of less than about 2.2 µm.

In some embodiments, there is an angle θ of the curved surface 103c of the molding 103 relative to the top surface 101a of the die 101. In some embodiments, the angle θ of the curved surface 103c of the molding 103 is about 20° to about 80°. In some embodiments, the curved surface 103c of the molding 103 is in a parabolic shape.

In some embodiments, the curved surface 103c of the molding 103 is a rounded surface for smoothening a change of level between the top surface 101a of the die 101 and the top surface 103a of the molding 103. As the curved surface 103c of the molding 103 mitigates the change of levels between the top surface 101a of the die 101 and the top surface 103a of the molding 103, components subsequently disposed over the die 101 and the molding 103 are well attached with the top surface 101a of the die 101 and the top surface 103a of the molding 103, and therefore delamination of components is prevented.

In some embodiments, the top surface 103a of the molding 103 or the curved surface 103c of the molding 103 has a surface roughness (Ra) of about 0.07 µm to about 0.35 µm.

In some embodiments, the surface roughness (Ra) of the molding 103 is an average of levels within a surface area of about 1 mm$^2$ to about 25 mm$^2$ of the top surface 103a or the curved surface 103c of the molding 103. In some embodiments, the top surface 103a or the curved surface 103c of the molding 103 having the surface roughness (Ra) greater than 0.07 µm improves a bondability of the top surface 101a of the die 101 or the top surface 103a of the molding 103 with components subsequently disposed over the die 101 and the molding 103.

Figure 2:
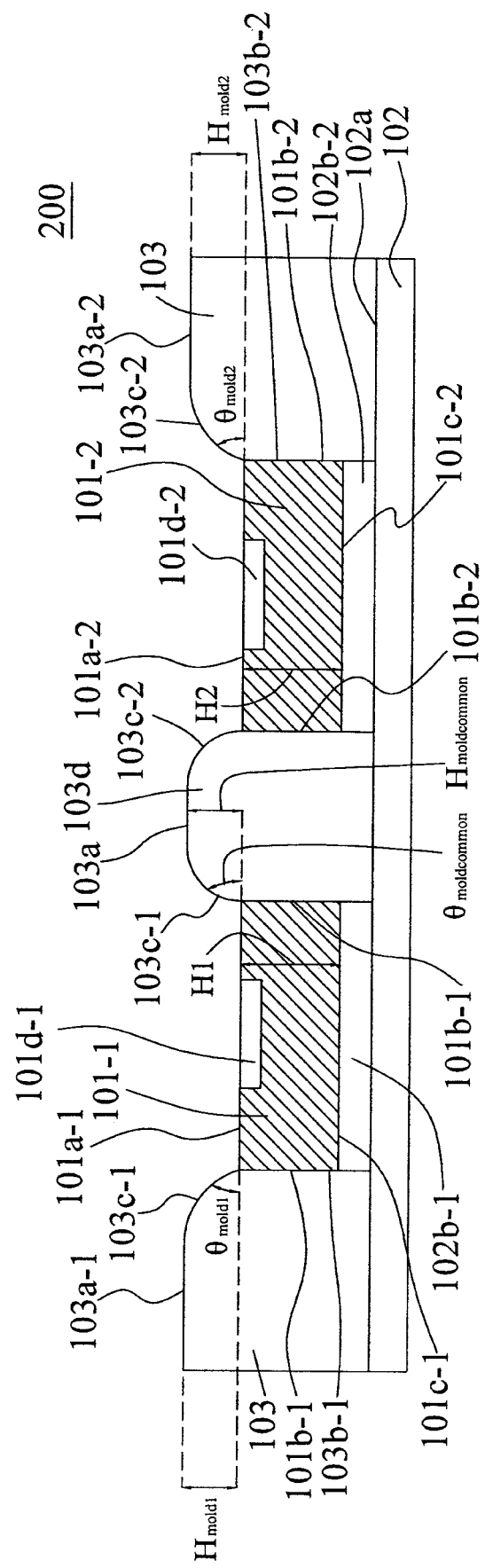
FIG. 2 is a schematic view of a semiconductor structure with two dies surrounded by a curved surface of a molding in accordance with some embodiments.

FIG. 2 is a semiconductor structure 200 in accordance with various embodiments of the present disclosure. The semiconductor structure 200 includes a substrate 102. In some embodiments, the substrate 102 has a similar configuration as the substrate 102 of FIG. 1. In some embodiments, the substrate 102 includes a top surface 101a for receiving a die.

In some embodiments, the semiconductor structure 200 includes a first die 101-1 and a second die 101-2. In some embodiments, the first die 101-1 and the second die 101-2 have similar configuration as the die 101 of FIG. 1 respectively. In some embodiments, the first die 101-1 is a logic die and the second die 101-2 is a dynamic random access memory (DRAM) die. In some embodiments, the first die 101-1 and the second die 101-2 are disposed on the substrate 102 by an adhesive 102b-1 and 102b-2 respectively.

In some embodiments, the first die 101-1 includes a first top surface 101a-1, a first sidewall 101b-1 and a first bottom surface 101c-1. In some embodiments, the first bottom surface 101c-1 is attached with the top surface 102a of the substrate 102 by the adhesive 102b-1. In some embodiments, the first sidewall 101b-1 is substantially orthogonal to the first top surface 101a-1. In some embodiments, the first die 101-1 includes a die pad 101d-1 which has similar configuration as the die pad 101d of FIG. 1.

In some embodiments, the second die 101-2 includes a second top surface 101a-2, a second sidewall 101b-2 and a second bottom surface 101c-2. In some embodiments, the second bottom surface 101c-2 is attached with the top surface 102a of the substrate 102 by an adhesive 102b-2. In some embodiments, the second sidewall 101b-2 is substantially orthogonal to the second top surface 101a-2. In some embodiments, the second die 101-2 includes a die pad 101d-2 which has similar configuration as the die pad 101d of FIG. 1.

In some embodiments, the first die 101-1 has a height H1 from the first bottom surface 101c-1 to the first top surface 101a-1, and the second die 101-2 has a height H2 from the second bottom surface 101c-2 to the second top surface 101a-2. In some embodiments, the height H1 is substantially same as the height H2. In some embodiments, the height H1 is greater than the height H2.

In some embodiments, the semiconductor structure 200 includes a molding 103 disposed on the substrate 102 and surrounding the first die 101-1 and the second die 101-2. In some embodiments, the molding 103 has similar configuration as the molding of FIG. 1.

In some embodiments, the molding 103 adjacent to the first die 101-1 includes a first top surface 103a-1, a first sidewall 103b-1 and a first curved surface 103c-1 including a first curvature. In some embodiments, the first top surface 103a-1, the first sidewall 103b-1 and the first curved surface 103c-1 have similar configuration as the top surface 103a, the sidewall 103b and the curved surface 103c of FIG. 1 respectively.

In some embodiments, the first top surface 103a-1 of the molding 103 is at a level substantially higher than the first top surface 101a-1 of the first die 101-1. In some embodiments, a level difference $H_{mold1}$ between the first top surface 101a-1 and the first top surface 103a-1 is less than about 2.2 μm. In some embodiments, an angle $θ_{mold1}$ of the first curved surface 103c-1 of the molding 103 relative to the first top surface 101a-1 of the first die 101-1 is about 20° to about 80°.

In some embodiments, the molding 103 adjacent to the second die 101-2 includes a second top surface 103a-2, a second sidewall 103b-2 and a second curved surface 103c-2 including a second curvature. In some embodiments, the second top surface 103a-2, the second sidewall 103b-2 and the second curved surface 103c-2 have similar configuration as the top surface 103a, the sidewall 103b and the curved surface 103c of FIG. 1 respectively. In some embodiments, the second curvature of the second curved surface 103c-2 is substantially different from the first curvature of the first curved surface 103c-1. In some embodiments, the second curvature of the second curved surface 103c-2 is substantially same as the first curvature of the first curved surface 103c-1.

In some embodiments, the second top surface 103a-2 of the molding 103 is at a level substantially higher than the second top surface 101a-2 of the second die 101-2. In some embodiments, a level difference $H_{mold2}$ between the second top surface 101a-2 and the second top surface 103a-2 is less than about 2.2 μm. In some embodiments, the level difference $H_{mold2}$ is substantially different from the level difference $H_{mold1}$. In some embodiments, the level difference $H_{mold2}$ is substantially same as the level difference $H_{mold1}$.

In some embodiments, an angle $θ_{mold2}$ of the second curved surface 103c-2 of the molding 103 relative to the second top surface 101a-2 of the second die 101-2 is about 20° to about 80°. In some embodiments, the angle $θ_{mold2}$ is substantially different from the angle $θ_{mold1}$. In some embodiments, the angle $θ_{mold2}$ is substantially same as the angle $θ_{mold1}$.

In some embodiments, the first die 101-1 and the second die 101-2 are separated by a common portion 103d of the molding 103. In some embodiments, the common portion 103d of the molding 103 includes a top surface 103a, the first curved surface 103c-1 and the second curved surface 103c-2. In some embodiments, the top surface 103a is coupled with the first curved surface 103c-1 and the second curved surface 103c-2.

In some embodiments, a level difference $H_{moldcommon}$ between the first top surface 101a-1 of the first die 101-1 or the second top surface 101a-2 of the second die 101-2 is less than about 2.2 μm. In some embodiments, the level difference $H_{moldcommon}$ is substantially different from the $H_{mold1}$ or $H_{mold2}$. In some embodiments, the level difference $H_{moldcommon}$ is substantially same as the $H_{mold1}$ or $H_{mold2}$.

In some embodiments, an angle $θ_{moldcommon}$ of the first curved surface 103c-1 of the molding 103 relative to the first top surface 101a-1 of the first die 101-1 is about 20° to about 80°. In some embodiments, the angle $θ_{moldcommon}$ of the second curved surface 103c-2 of the molding 103 relative to the second top surface 101a-2 of the second die 101-2 is about 20° to about 80°. In some embodiments, the angle $θ_{moldcommon}$ is substantially different from the angle $θ_{mold1}$. In some embodiments, the angle $θ_{moldcommon}$ is substantially same as the angle $θ_{mold1}$. In some embodiments, the angle $θ_{moldcommon}$ is substantially different from the angle $θ_{mold2}$. In some embodiments, the angle $θ_{moldcommon}$ is substantially same as the angle $θ_{mold2}$.

FIG. 3 is a semiconductor structure 300 in accordance with various embodiments of the present disclosure. The semiconductor structure 300 includes a die 101 which is in a similar configuration as the die 101 of FIG. 1. In some embodiments, the die 101 includes a top surface 101a, a sidewall 101b and a bottom surface 101c. In some embodiments, the top surface 101a of the die 101 is substantially orthogonal to the sidewall 101b of the die 101. In some embodiments, the die 101 includes a die pad 101d exposed from the top surface 101a of the die 101.

In some embodiments, the semiconductor structure 300 includes a substrate 102 which is in a similar configuration as the substrate 102 of FIG. 1. In some embodiments, the die 101 is disposed on the substrate 102. In some embodiments, the bottom surface 101c of the die 101 is attached with a top surface 102a of the substrate 102 by an adhesive 102b.

In some embodiments, the semiconductor structure 300 includes a molding 103 surrounding the die 101. In some embodiments, the molding 103 includes epoxy resin. In some embodiments, the molding 103 includes a top surface 103a and a sidewall 103b. In some embodiments, the top surface 103a of the molding 103 is at a level substantially same as the top surface 101a of the die 101. In some embodiments, the top surface 103a of the molding 103 is substantially parallel to the top surface 101a of the die 101.

In some embodiments, the top surface 103a of the molding 103 is coupled with the sidewall 103b of the molding 103. In some embodiment, the top surface 103a of the molding 103 is substantially orthogonal to the sidewall 103b of the molding 103. In some embodiments, the top surface 103a of the molding 103 is coupled with the sidewall 101b of the die 101. In some embodiments, the top surface 103a of the molding 103 is substantially orthogonal to the sidewall 101b of the die 101.

FIG. 4 is a semiconductor structure 400 in accordance with various embodiments of the present disclosure. The semiconductor structure 400 includes a substrate 102. In some embodiments, the substrate 102 has a similar configuration as the substrate 102 of FIG. 3. In some embodiments, the substrate 102 includes a top surface 101a for receiving a die.

In some embodiments, the semiconductor structure 400 includes a first die 101-1 and a second die 101-2. In some embodiments, the first die 101-1 and the second die 101-2 have similar configuration as the die 101 of FIG. 3 respectively. In some embodiments, the first die 101-1 is a logic die and the second die 101-2 is a dynamic random access memory (DRAM) die. In some embodiments, the first die 101-1 and the second die 101-2 are disposed on the substrate 102 by an adhesive 102b-1 and 102b-2 respectively.

In some embodiments, the first die 101-1 includes a first top surface 101a-1, a first sidewall 101b-1 and a first bottom surface 101c-1. In some embodiments, the first bottom surface 101c-1 is attached with the top surface 102a of the substrate 102 by the adhesive 102b-1. In some embodiments, the first sidewall 101b-1 is substantially orthogonal to the first top surface 101a-1. In some embodiments, the first die 101-1 includes a die pad 101d-1 which has similar configuration as the die pad 101d of FIG. 3.

In some embodiments, the second die 101-2 includes a second top surface 101a-2, a second sidewall 101b-2 and a second bottom surface 101c-2. In some embodiments, the second bottom surface 101c-2 is attached with the top surface 102a of the substrate 102 by an adhesive 102b-2. In some embodiments, the second sidewall 101b-2 is substantially orthogonal to the second top surface 101a-2. In some embodiments, the second die 101-2 includes a die pad 101d-2 which has similar configuration as the die pad 101d of FIG. 1.

In some embodiments, the first die 101-1 has a height H1 from the first bottom surface 101c-1 to the first top surface 101a-1, and the second die 101-2 has a height H2 from the second bottom surface 101c-2 to the second top surface 101a-2. In some embodiments, the height H1 is substantially same as the height H2. In some embodiments, the height H1 is greater than the height H2.

In some embodiments, the semiconductor structure 400 includes a molding 103 disposed on the substrate 102 and surrounding the first die 101-1 and the second die 101-2. In some embodiments, the molding 103 has similar configuration as the molding of FIG. 3. In some embodiments, the molding 103 adjacent to the first die 101-1 includes a first top surface 103a-1 and a first sidewall 103b-1 which are in similar configuration as the top surface 103a and the sidewall 103b of FIG. 3 respectively.

In some embodiments, the first top surface 103a-1 of the molding 103 is at a level substantially same as the first top surface 101a-1 of the first die 101-1. In some embodiments, the second top surface 103a-2 of the molding 103 is at a level substantially same as the second top surface 101a-2 of the second die 101-2. In some embodiments, the first top surface 103a-1 of the molding 103, the first top surface 101a-1 of the first die 101-1, the second top surface 103a-2 of the molding 103 and the second top surface 101a-2 of the second die 101-2 are at a substantially same level.

In some embodiments, the first die 101-1 and the second die 101-2 are separated by a common portion 103d of the molding 103. In some embodiments, the common portion 103d of the molding 103 includes a top surface 103a coupled with the first sidewall 103b-1 and the second sidewall 103b-2 of the molding 103. In some embodiments, the top surface 103a is at a level substantially same as the first top surface 103a-1 and the second top surface 103a-2. In some embodiments, the first top surface 103a-1, the first top surface 101a-1, the top surface 103a, the second top surface 103a-2 and the second top surface 101a-2 are at a substantially same level.

Figure 5:
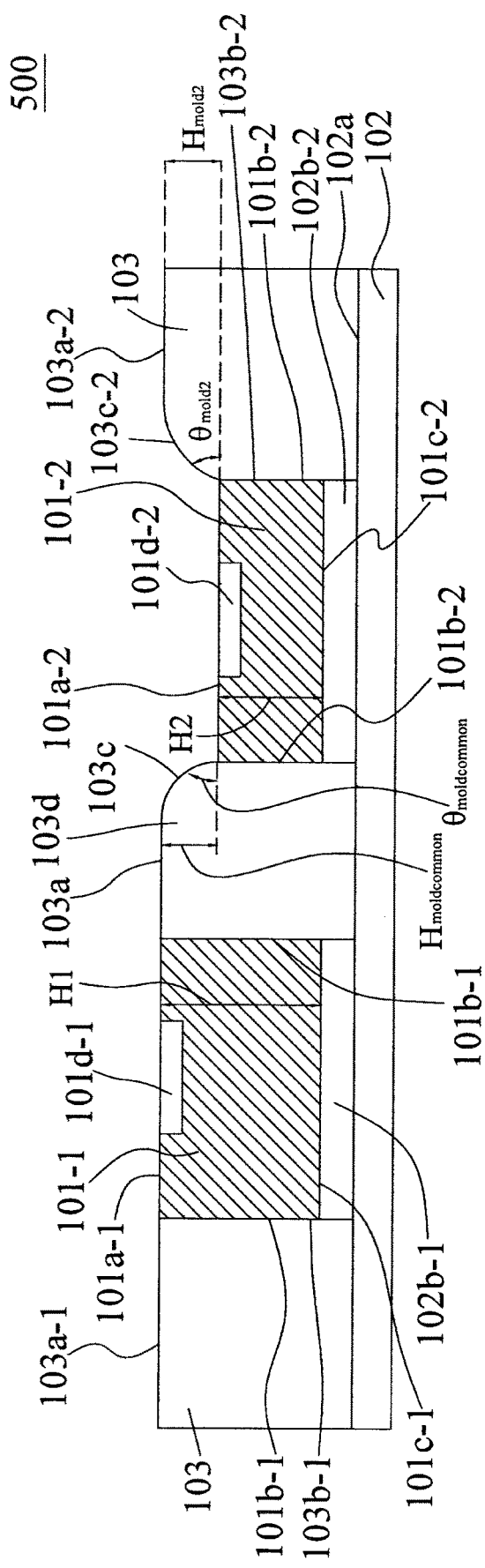
FIG. 5 is a schematic view of a semiconductor structure with two dies in different height in accordance with some embodiments.

FIG. 5 is a semiconductor structure 500 in accordance with various embodiments of the present disclosure. The semiconductor structure 500 includes a substrate 102. In some embodiments, the substrate 102 has a similar configuration as the substrate 102 of FIG. 2 and FIG. 4. In some embodiments, the substrate 102 includes a top surface 102a for receiving a die.

In some embodiments, the semiconductor structure 200 includes a first die 101-1 and a second die 101-2. In some embodiments, the first die 101-1 and the second die 101-2 have similar configuration as the first die 101-1 and the second die 101-2 of FIG. 2 or FIG. 4 respectively. In some embodiments, the first die 101-1 is a dynamic random access memory (DRAM) die and the second die 101-2 is a logic die. In some embodiments, the first die 101-1 and the second die 101-2 are disposed on the substrate 102 by an adhesive 102b-1 and 102b-2 respectively. In some embodiments, a height H1 of the first die 101-1 from a first bottom surface 101c-1 to a first top surface 101a-1 is substantially greater than a height H2 of the second die 101-2 from a second bottom surface 101c-2 to a second top surface 101a-2.

In some embodiments, the semiconductor structure 500 includes a molding 103 disposed on the substrate 102 and surrounding the first die 101-1 and the second die 101-2. In some embodiments, the molding 103 includes a first top surface 103a-1 adjacent to the first die 101-1. In some embodiments, the first top surface 103a-1 of the molding 103 has similar configuration as the top surface 103a of FIG. 3. In some embodiments, the first top surface 103a-1 is at a level substantially same as the first top surface 101a-1 of the first die 101-1.

In some embodiments, the molding 103 adjacent to the second die 101-2 includes a second top surface 103a-2, a second sidewall 103b-2 and a second curved surface 103c-2 including a second curvature. In some embodiments, the second top surface 103a-2, the second sidewall 103b-2 and the second curved surface 103c-2 have similar configuration as the top surface 103a, the sidewall 103b and the curved surface 103c of FIG. 1 respectively.

In some embodiments, the second top surface 103a-2 is at a level substantially higher than the second top surface 101a-2 of the second die 101-2. In some embodiments, a level difference $H_{mold2}$ between the second top surface 101a-2 and the second top surface 103a-2 is less than about 2.2 μm. In some embodiments, an angle $\theta_{mold2}$ of the second curved surface 103c-2 of the molding 103 relative to the second top surface 101a-2 of the second die 101-2 is about 20° to about 80°.

In some embodiments, the first die 101-1 and the second die 101-2 are separated by a common portion 103d of the molding 103. In some embodiments, the common portion 103d of the molding 103 includes a top surface 103a and a curved surface 103c. In some embodiments, the top surface 103a is coupled with the curved surface 103c.

In some embodiments, a level difference $H_{moldcommon}$ between the top surface 103a and the second top surface 101a-2 of the second die 101-2 is less than about 2.2 μm. In some embodiments, the level difference $H_{moldcommon}$ is substantially different from the $H_{mold2}$. In some embodiments, the level difference $H_{moldcommon}$ is substantially same as the $H_{mold2}$.

In some embodiments, an angle $\theta_{moldcommon}$ of the curved surface 103c of the molding 103 relative to the second top surface 101a-2 of the second die 101-2 is about 20° to about 80°. In some embodiments, the angle $\theta_{moldcommon}$ is substantially different from the angle $\theta_{mold2}$. In some embodiments, the angle $\theta_{moldcommon}$ is substantially same as the angle $\theta_{mold2}$.

In some embodiments, the second curvature of the second curved surface 103c-2 is substantially different from a curvature of the curved surface 103c. In some embodiments, the second curvature of the second curved surface 103c-2 is substantially same as the curvature of the curved surface 103c.

Figure 6:
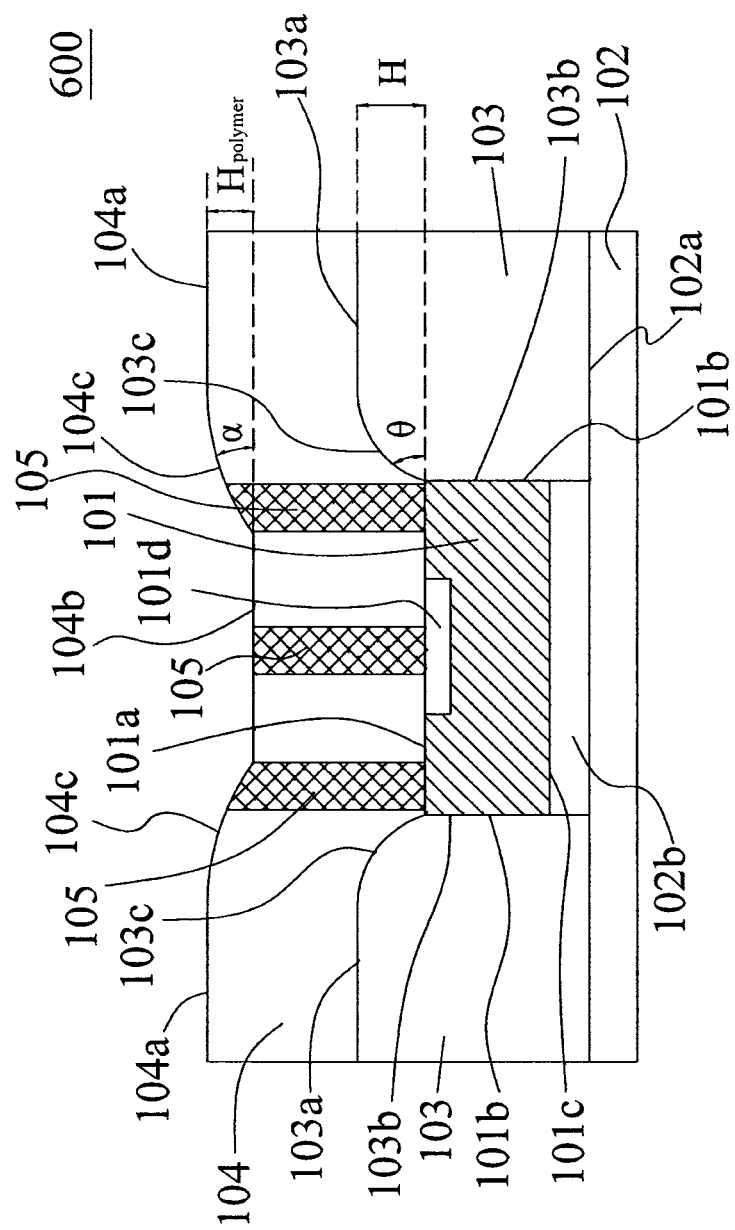
FIG. 6 is a schematic view of a semiconductor structure with a polymer and vias adjacent to a curved surface of a molding in accordance with some embodiments.

FIG. 6 is a semiconductor structure 600 in accordance with various embodiments of the present disclosure. The semiconductor structure 600 includes a die 101, a substrate 102 and a molding 103 which are in similar configuration as the die 101, the substrate 102 and the molding 103 of FIG. 1 respectively.

In some embodiments, the semiconductor structure 600 further includes a polymer 104 disposed over the molding 103 and the die 101. In some embodiments, the polymer 104 is conformal to a top surface 103a of the molding 103, a curved surface 103c of the molding 103 and a top surface 101a of the die 101. In some embodiments, the polymer 104 includes a polymeric material such as epoxy, polyimide, polybenzoxazole (PBO), and the like.

In some embodiments, the polymer 104 includes a first top surface 104a, a second top surface 104b and a curved surface 104c. In some embodiments, the first top surface 104a is parallel to the second top surface 104b. In some embodiments, the first top surface 104a is at a level substantially higher than the second top surface 104b. In some embodiments, the first top surface 104a is coupled with the second top surface 104b by the curved surface 104c.

In some embodiments, the curved surface 104c of the polymer 104 is in a parabolic shape. As the curved surface 103c of the molding 103 mitigates the change of levels between the top surface 101a of the die 101 and the top surface 103a of the molding 103, the polymer 104 disposed over the die 101 and the molding 103 are well attached with the top surface 101a of the die 101 and the top surface 103a of the molding 103, and therefore delamination of polymer 104 is prevented. In some embodiments, a level difference $H_{polymer}$ between the first top surface 104a and the second top surface 104b of the polymer 104 is substantially smaller than the level difference H between the top surface 101a of the die 101 and the top surface 103a of the molding 103.

In some embodiments, the curved surface 104c has a curvature substantially smaller than the curvature of the curved surface 103c of the molding 103. In some embodiments, there is an angle α of the curved surface 104c of the polymer 104 relative to the second top surface 104b of the polymer 104. In some embodiments the angle α of the curved surface 104c is substantially smaller than the angle θ of the curved surface 103c of the molding 103.

In some embodiments, the semiconductor structure 600 includes several vias 105 penetrating through the polymer 104 to the top surface 101a of the die 101. In some embodiments, the vias 105 are configured for electrically connecting a die pad 101d with a circuitry external to the die 101, so that the die pad 101d is connected to the external circuitry by a redistribution layer RDL through the vias 105. If there is a large height difference between the vias 105, some vias 105 may not be open. As the curved surface 103c of the molding 103 mitigates the change of levels between the top surface 101a of the die 101 and the top surface 103a of the molding 103, a height difference between vias 105 along the top surface 101a of the die 101 is reduced, and therefore a failure of opening the vias 105 through the polymer 104 is also reduced.

Figure 7:
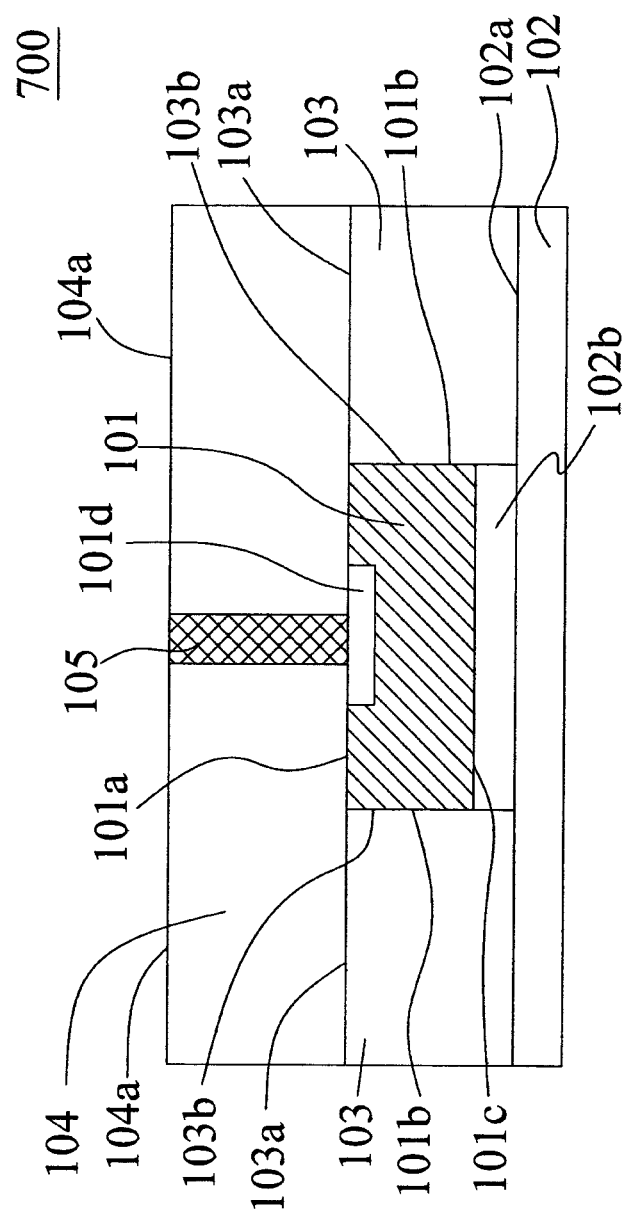
FIG. 7 is a schematic view of a semiconductor structure with a polymer and a via disposed over a die in accordance with some embodiments.

FIG. 7 is a semiconductor structure 700 in accordance with various embodiments of the present disclosure. The semiconductor structure 700 includes a die 101, a substrate 102 and a molding 103 which are in similar configuration as the die 101, the substrate 102 and the molding 103 of FIG. 3 respectively.

In some embodiments, the semiconductor structure 600 further includes a polymer 104 disposed over the molding 103 and the die 101. In some embodiments, the polymer 104 is conformal to a top surface 103a of the molding 103 and a top surface 101a of the die 101. In some embodiments, the polymer 104 includes a polymeric material such as epoxy, polyimide, polybenzoxazole (PBO), and the like.

In some embodiments, the polymer 104 includes a top surface 104a. In some embodiments, the top surface 104a is parallel to the top surface 101a of the die 101. In some embodiments, the top surface 104a of the polymer 104 is at a constant level along the top surface 103a of the molding 103 and the top surface 101a of the die 101. In some embodiments, the semiconductor structure 700 includes a via 105 penetrating through the polymer 104 to the top surface 101a of the die 101. In some embodiments, the via 105 is configured for electrically connecting a die pad 101d with a circuitry external to the die 101, so that the die pad 101d is connected to the external circuitry by a redistribution layer RDL through the via 105.

In the present disclosure, a method of manufacturing a semiconductor structure is also disclosed. In some embodiments, a semiconductor structure is formed by a method 800. The method 800 includes a number of operations and the description and illustration are not deemed as a limitation as the sequence of the operations.

Figure 8:
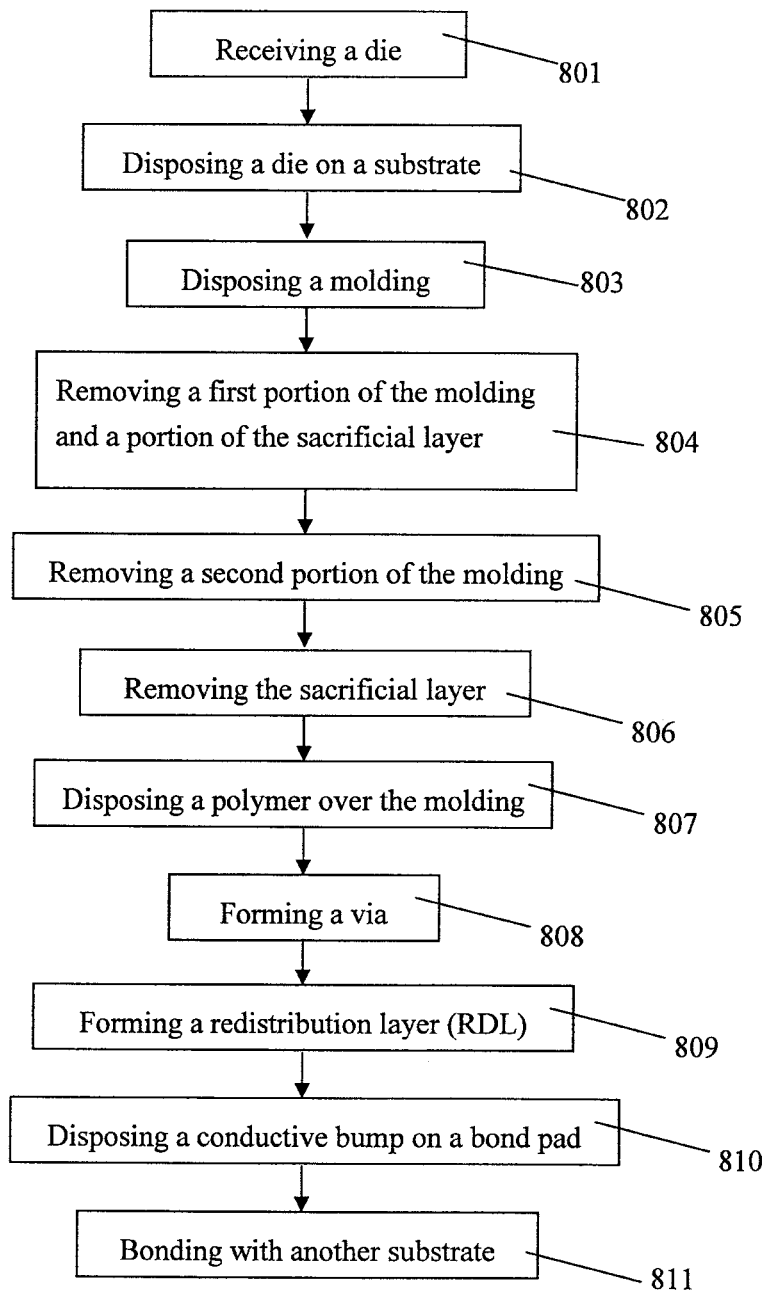
FIG. 8 is a flow diagram of a method of manufacturing a semiconductor structure in accordance with some embodiments.

FIG. 8 is a flowchart of a method 800 of manufacturing a semiconductor structure in accordance with various embodiments of the present disclosure. The method 800 includes a number of operations (801, 802, 803, 804, 805, 806, 807, 808, 809, 810 and 811).

Figure 8A:
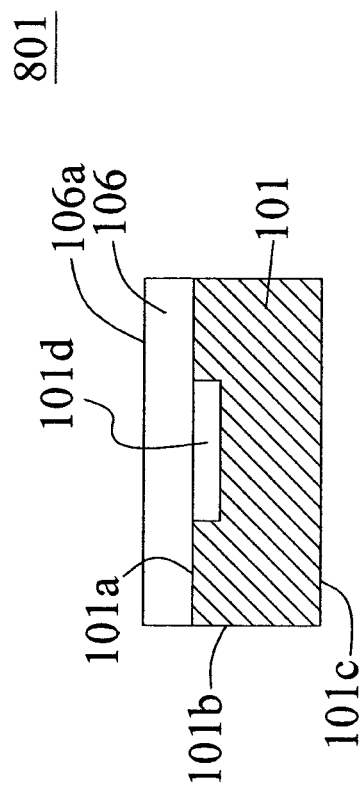
FIG. 8A is a schematic view of a die with a sacrificial layer in accordance with some embodiments.

In operation 801, a die 101 is received as in FIG. 8A. In some embodiments, the die 101 has similar configuration as the die 101 of FIG. 1. In some embodiments, the die 101 is singulated from a wafer. In some embodiments, the die 101 includes a top surface 101a, a sidewall 101b and a bottom surface 101c. In some embodiments, the die 101 includes a die pad 101d exposed from the top surface 101a of the die 101.

In some embodiments, the die 101 includes a sacrificial layer 106 covering the top surface 101a and the die pad 101d of the die 101. In some embodiments, the sacrificial layer 106 is configured for protecting the die 101 from damage during a subsequent grinding operation. In some embodiments, the sacrificial layer 106 includes polymer. In some embodiments, the sacrificial layer 106 includes a top surface 106a.

Figure 8B:
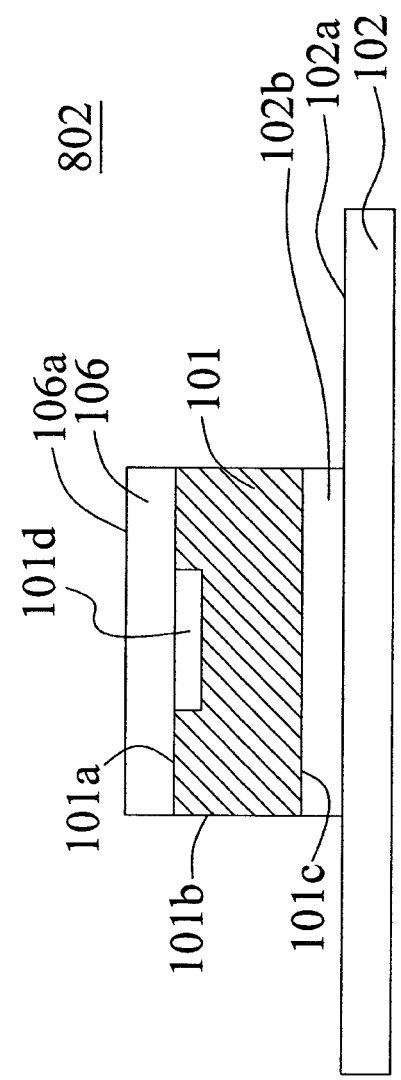
FIG. 8B is a schematic view of a die disposed on a substrate in accordance with some embodiments.

In operation 802, the die 101 is disposed on a substrate 102 as in FIG. 8B. In some embodiments, the substrate 102 has similar configuration as the substrate 102 of FIG. 1. In some embodiments, the die 101 is attached on the substrate 102 by an adhesive 102b. In some embodiments, the bottom surface 101c of the die 101 is attached with a top surface 102a of the substrate 102 by the adhesive 102b.

In operation 803, a molding 103 is disposed as in FIG. 8C. In some embodiments, the molding 103 surrounds the die 101 and covers the sacrificial layer 106. In some embodiments, the molding 103 is disposed on the substrate 102 and encapsulates the die 101. In some embodiments, the molding 103 has a top surface 103a. In some embodiments, the top surface 103a is parallel to the top surface 101a of the die 101.

In operation 804, a first portion of the molding 103 and a portion of the sacrificial layer 106 are removed to expose the top surface 106a of the sacrificial layer 106 as in FIG. 8D. In some embodiments, the first portion of the molding 103 and the portion of the sacrificial layer 106 are removed by a grinding operation for reducing a thickness of the semiconductor structure 800'.

In some embodiments, the first portion of the molding 103 and the portion of the sacrificial layer 106 are ground from the top surface 103a and the top surface 106a, such that the top surface 103a and the top surface 106a become a new top surface 103a' and a new top surface 106a' respectively. In some embodiments, the new top surface 103a' of the molding 103 is at a level substantially same as the new top surface 106a' of the sacrificial layer 106.

In operation 805, a second portion of the molding 103 is removed to expose a sidewall 106b of the sacrificial layer 106 as in FIG. 8E. In some embodiments, the second portion of the molding 103 is removed by a plasma etching operation. In some embodiments, the plasma etching operation includes connecting the substrate 102 to a grounded or powered electrode and exposing the molding 103 to a plasma including charged ions or neutral atoms. In some embodiments, the plasma chemically reacts with the second portion of the molding 103 to form a volatile etch product, then the volatile etch product is removed from the molding 103, and thus the second portion of the molding 103 is removed upon the chemical reaction between the plasma and the molding 103. In some embodiments, the second portion of the molding 103 is etched away from the new top surface 103a' of the molding 103, such that the new top surface 103a' becomes another new top surface 103a" of the molding 103 and a curved surface 103c of the molding 103.

In some embodiments, the plasma etching operation includes flowing a gas mixture including carbon tetrafluoride ($CF_4$), oxygen ($O_2$) and nitrogen ($N_2$) towards the molding 103. In some embodiments, $CF_4$ is flown in a rate of about 200 sccm (standard cubic centimeter per minute), $O_2$ is flown in a rate of about 400 sccm, and $N_2$ is flown in a rate of about 800 sccm. In some embodiments, the gas mixture is powered by a source with a power of about 500 Watt. In some embodiments, the plasma etching operation is performed under a temperature of about 60° C. to about 80° C. In some embodiments, the temperature is about 70° C. In some embodiments, the plasma etching operation is performed under a pressure of about 60 Pascal to about 80 Pascal. In some embodiments, the pressure is about 75 Pascal. In some embodiments, the plasma etching operation takes about 15 to about 30 seconds to remove the second portion of the molding 103. In some embodiments, the plasma etching operation takes about 20 seconds to remove the second portion of the molding 103.

In some embodiments, the curved surface 103c is formed adjacent to a periphery of the top surface 101a of the die 101. In some embodiments, the new top surface 103a" is at a level substantially higher than the top surface 101a of the die 101. In some embodiments, the new top surface 103a" and the curved surface 103c are in similar configuration as the top surface 103a and the curved surface 103c of FIG. 1 respectively.

In some embodiments, the second portion of the molding 103 is removed to reduce a height of the molding 103 from the top surface 101a of the die 101 to a height H of less than about 2.2 μm. In some embodiments, the curved surface 103c includes a curvature greater than zero after removing the second portion of the molding 103. In some embodiments, an angle θ of the curved surface 103c of the molding 103 relative to the top surface 101a of the die 101 is formed after removing the second portion of the molding 103.

In some embodiments, a surface roughness (Ra) of the molding 103 is increased after removing the second portion of the molding 103. In some embodiments, the surface roughness (Ra) of the new top surface 103a" or the curved surface 103c is increased and is greater than 0.07 μm.

In operation 806, the sacrificial layer 106 is removed as in FIG. 8F. In some embodiments, the sacrificial layer 106 is removed by a wet etching operation.

Figure 8G:
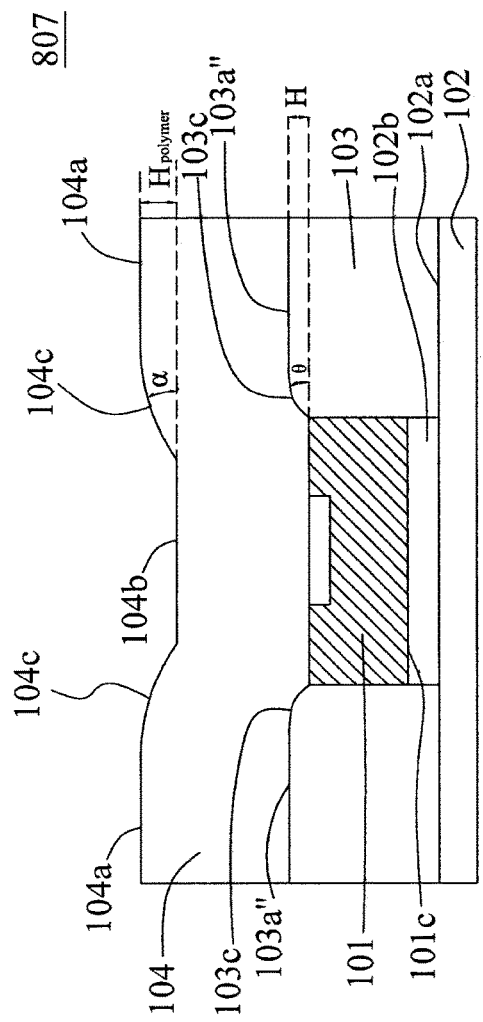
FIG. 8G is a schematic view of a polymer disposed over a die in accordance with some embodiments.

In operation 807, a polymer 104 is disposed over the molding 103 as in FIG. 8G. In some embodiments, the polymer 104 includes a first top surface 104a, a second top surface 104b and a curved surface 104c. In some embodiments, the first top surface 104a is at a level substantially higher than the second top surface 104b. In some embodiments, the first top surface 104a is coupled with the second top surface 104b by the curved surface 104c.

In some embodiments, a level difference $H_{polymer}$ between the first top surface 104a and the second top surface 104b of the polymer 104 is substantially smaller than the level difference H between the top surface 101a of the die 101 and the new top surface 103a" of the molding 103.

In some embodiments, the curved surface 104c has a curvature substantially smaller than the curvature of the curved surface 103c of the molding 103. In some embodiments, an angle α of the curved surface 104c of the polymer 104 relative to the second top surface 104b of the polymer 104 is substantially smaller than the angle θ of the curved surface 103c of the molding 103.

Figure 8H:
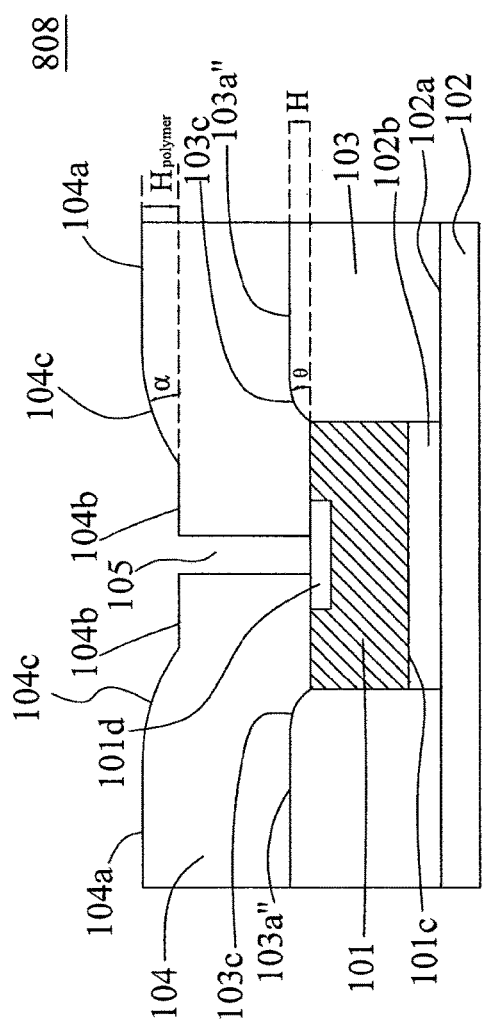
FIG. 8H is a schematic view of a via passed through a polymer in accordance with some embodiments.

In operation 808, a via 105 is formed through the polymer 104 as in FIG. 8H. In some embodiments, the via 105 is formed by photolithography and etching. In some embodiments, the via 105 passes from the second top surface 104b to the die pad 101d through the polymer 104.

Figure 8I:
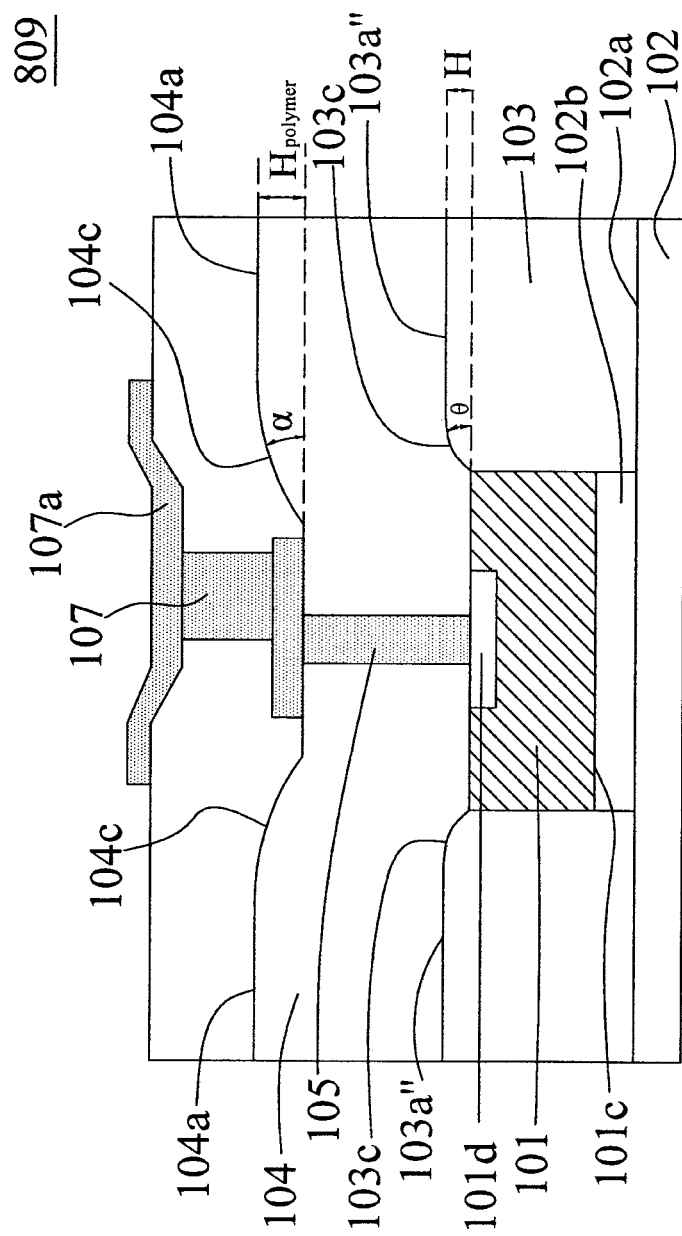
FIG. 8I is a schematic view of a redistribution layer (RDL) disposed over a die in accordance with some embodiments.

In operation 809, a redistribution layer (RDL) 107 is formed as in FIG. 8I. In some embodiments, the RDL 107 includes a conductive trace electrically connecting the die pad 101d through the via 105. In some embodiments, a bond pad 107a connected to the die pad 101d through the via 105 is disposed over the polymer 104 for receiving a conductive bump. In some embodiments, the bond pad 107a is an under bump metallurgy (UBM) pad.

Figure 8J:
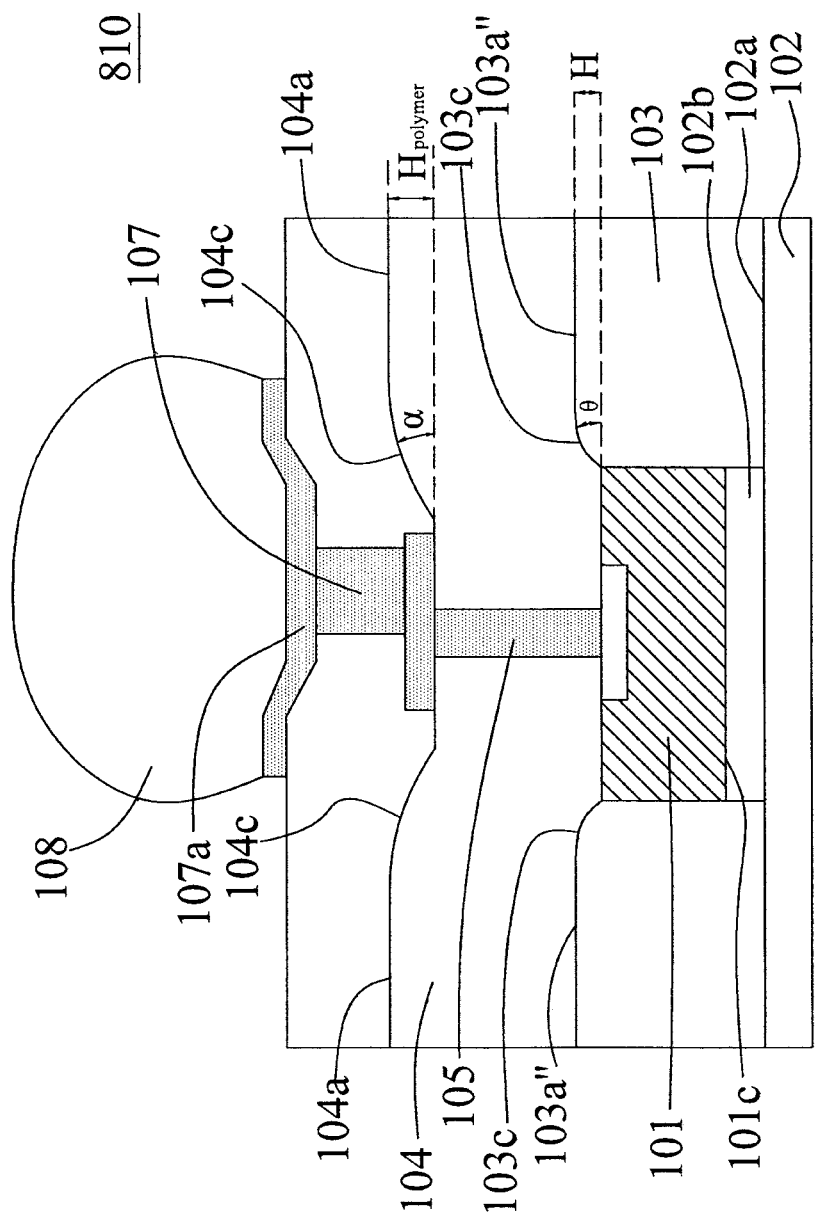
FIG. 8J is a schematic view of a conductive bump disposed on a bond pad in accordance with some embodiments.

In operation 810, a conductive bump 108 is disposed on the bond pad 107a as in FIG. 8J. In some embodiments, the conductive bump 108 is configured for attaching on a pad of another substrate. In some embodiments, the conductive bump 108 includes solder.

Figure 8K:
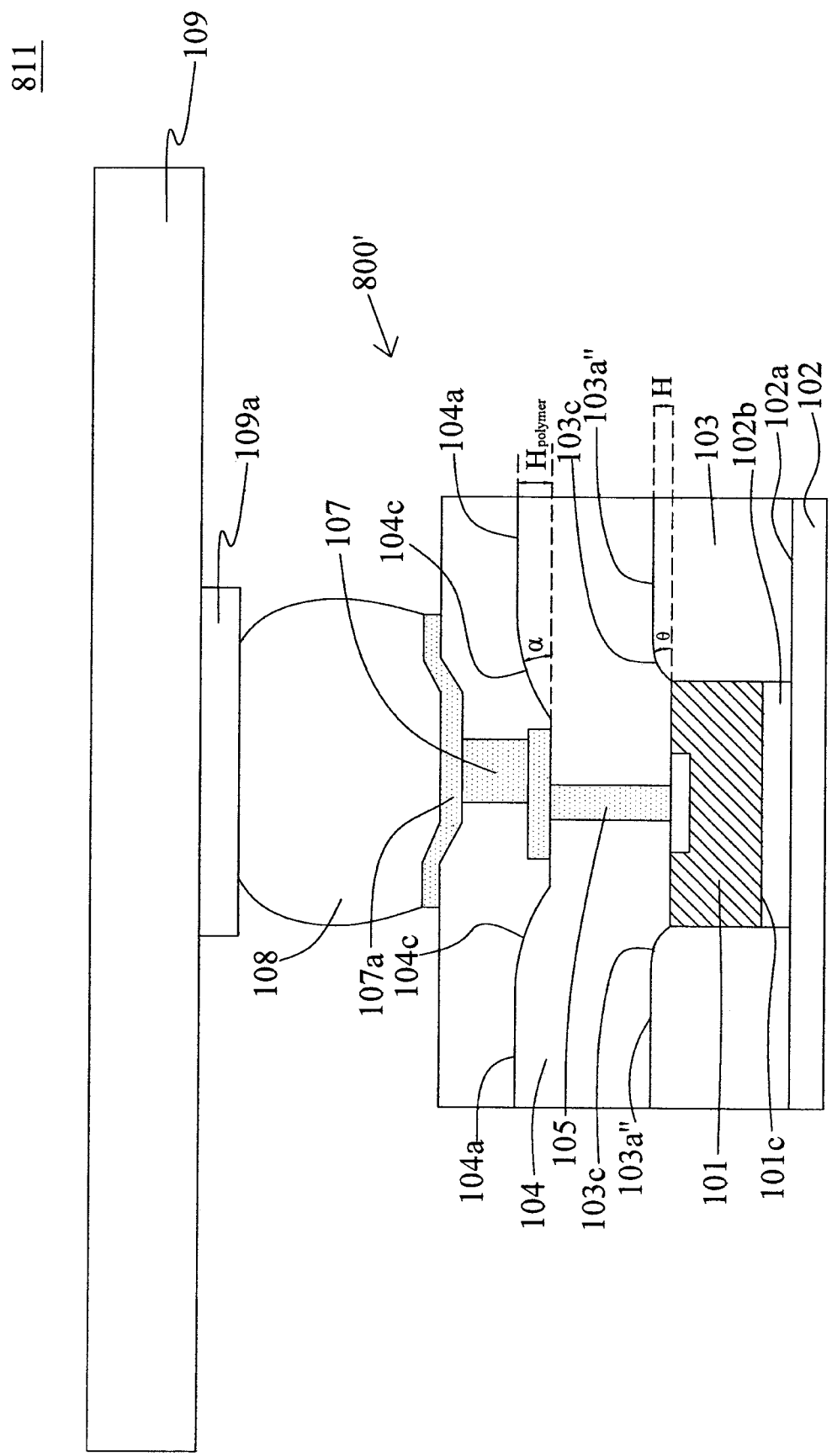
FIG. 8K is a schematic view of a pad of another substrate bonded with a conductive bump in accordance with some embodiments.

In operation 811, the semiconductor structure 800' is bonded with another substrate 109 as in FIG. 8K. In some embodiments, the conductive bump 108 is attached with a pad 109a of another substrate 109, such that a circuitry of the die 101 is electrically connected with a circuitry of the substrate 109 through the die pad 101d, the via 105, the RDL 107, the bond pad 107a, the conductive bump 108 and the pad 109a. In some embodiments, the semiconductor structure 800' is bonded with the substrate 109 to form a semiconductor package.

In the present disclosure, a method of manufacturing a semiconductor structure is also disclosed. In some embodiments, a semiconductor structure is formed by a method 900. The method 900 includes a number of operations and the description and illustration are not deemed as a limitation as the sequence of the operations.

Figure 9:
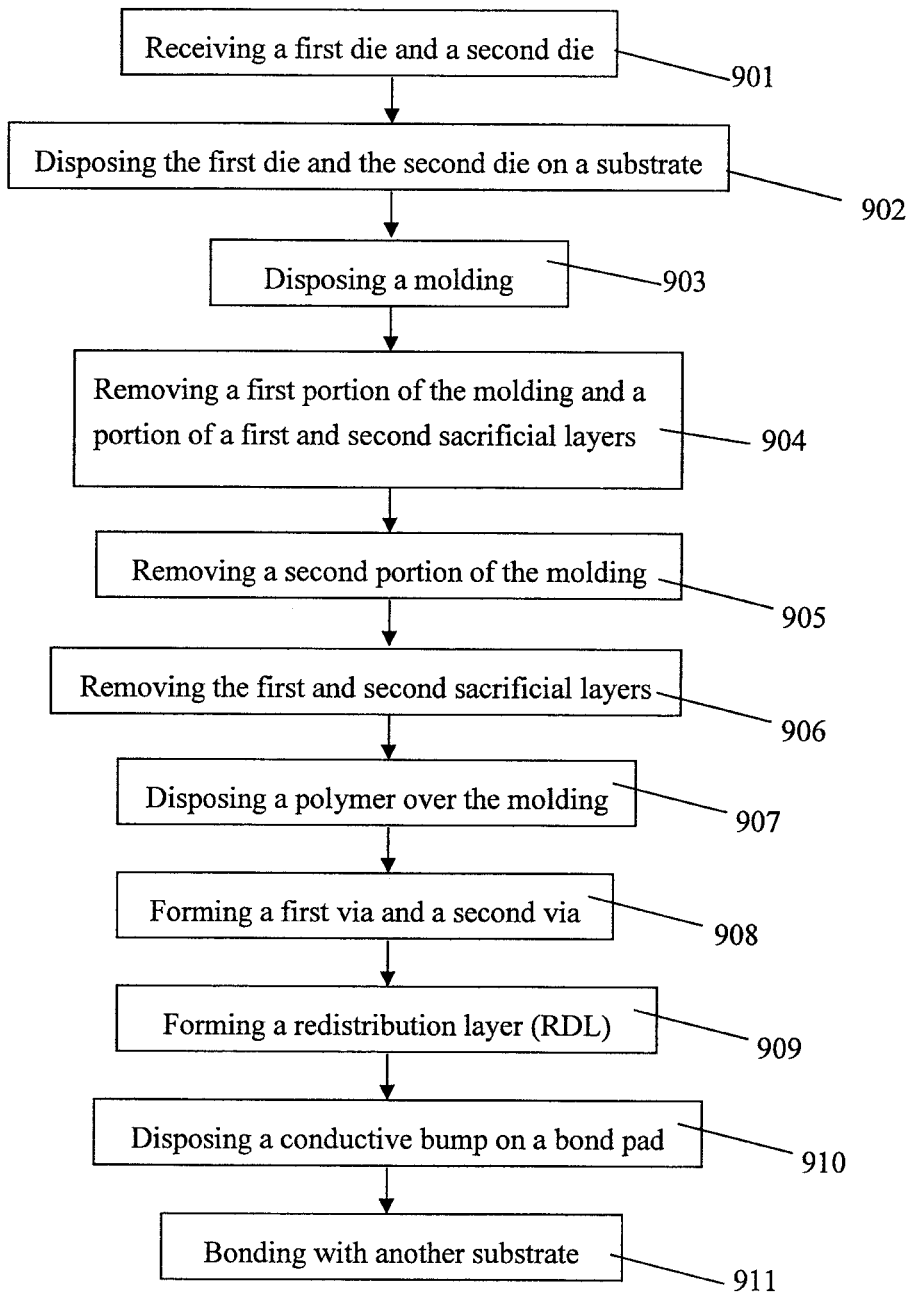
FIG. 9 is a flow diagram of a method of manufacturing a semiconductor structure in accordance with some embodiments.

FIG. 9 is a flowchart of a method 900 of manufacturing a semiconductor structure in accordance with various embodiments of the present disclosure. The method 600 includes a number of operations (901, 902, 903, 904, 905, 906, 907, 908, 909, 910 and 911).

Figure 9A:
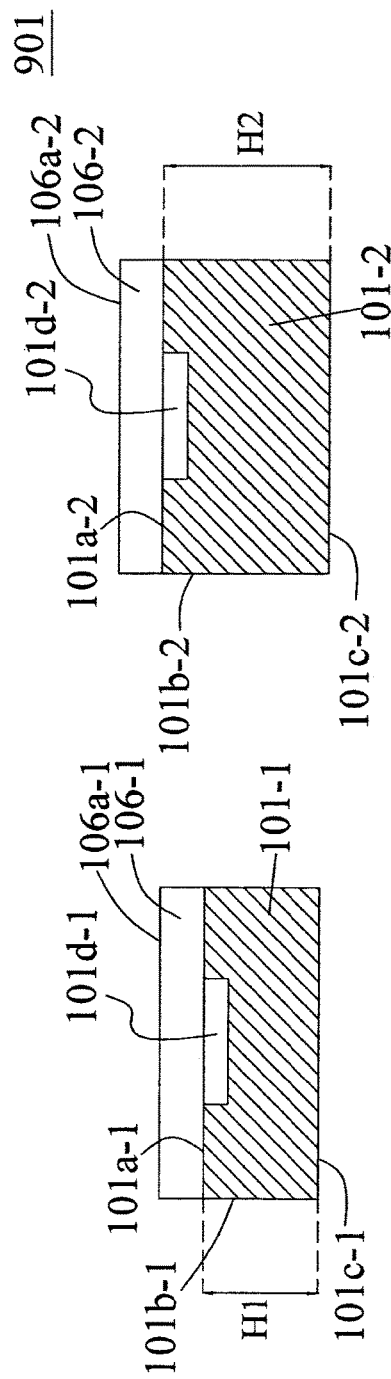
FIG. 9A is a schematic view of a first die and a second die in accordance with some embodiments.

In operation 901, a first die 101-1 and a second die are received as in FIG. 9A. In some embodiments, the first die 101-1 and the second die 101-2 have similar configuration as the die 101 of FIG. 1 respectively. In some embodiments, the first die 101-1 includes a first die pad 101d-1 exposed from a first top surface 101a-1 of the first die 101-1, and the second die 101-2 includes a second die pad 101d-2 exposed from a second top surface 101a-2 of the second die 101-2.

In some embodiments, the first die 101-1 has a height H1 and the second die 101-2 has a height H2. In some embodiments, the height H1 is different from the height H2. In some embodiments, the height H1 is smaller than the height H2.

In some embodiments, the first die 101-1 and the second die 101-2 include a first sacrificial layer 106-1 and a second sacrificial layer 106-2 respectively. The first sacrificial layer 106-1 covers the first top surface 101a-1 and the first die pad 101d-1, and the second sacrificial layer 106-2 covers the second top surface 101a-2 and the second die pad 101d-2. In some embodiments, the first sacrificial layer 106-1 and the second sacrificial layer 106-2 include a first top surface 106a-1 and a second top surface 106a-2 respectively.

Figure 9B:
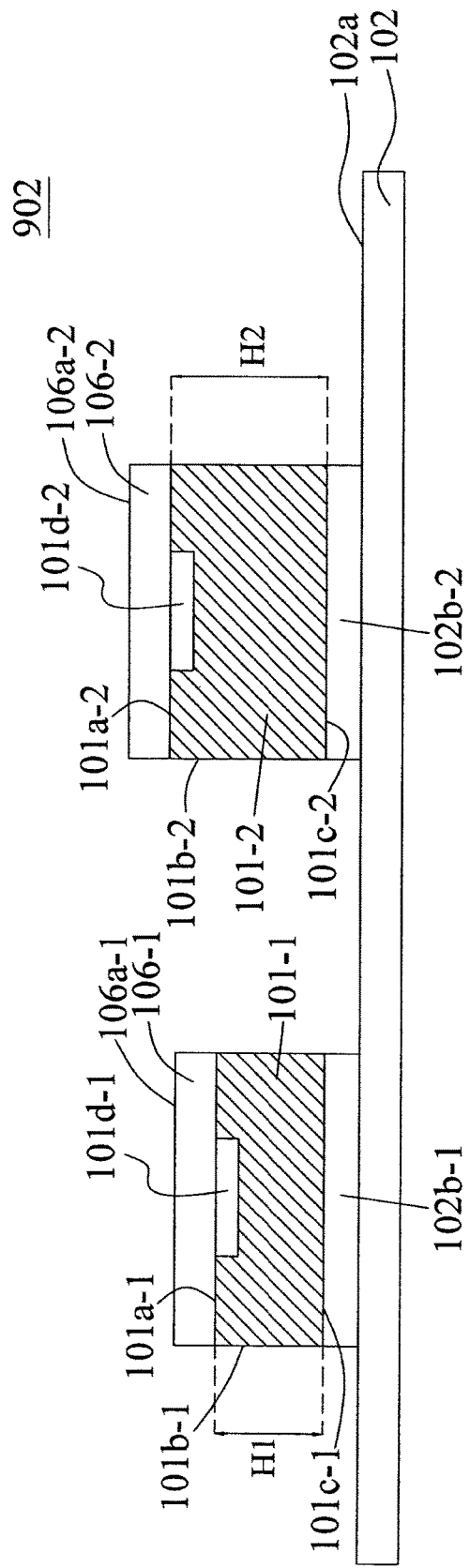
FIG. 9B is a schematic view of a first die and a second die disposed on a substrate in accordance with some embodiments.

In operation 902, the first die 101-1 and the second die 101-2 are disposed on a substrate 102 as in FIG. 9B. In some embodiments, the first die 101-1 and the second die 101-2 are attached on the substrate 102 by a first adhesive 102b-1 and a second adhesive 102b-2. In some embodiments, the operation 902 is similar to the operation 802 as in FIG. 8B.

Figure 9C:
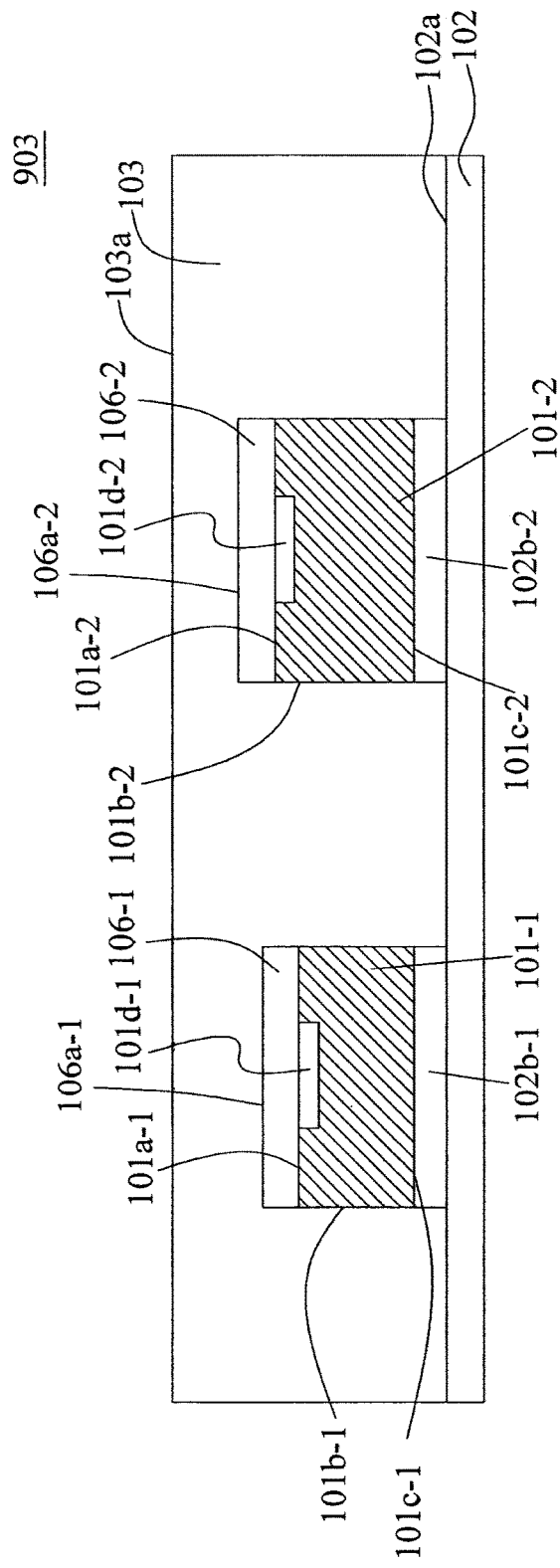
FIG. 9C is a schematic view of a first die and a second die surrounded by a molding in accordance with some embodiments.

In operation 903, a molding 103 is disposed as in FIG. 9C. In some embodiments, the operation 903 is similar to the operation 803 as in FIG. 8C. In some embodiments, the molding 103 encapsulates the first die 101-1 and the second die 101-2. In some embodiments, the molding 103 has a top surface 103a.

Figure 9D:
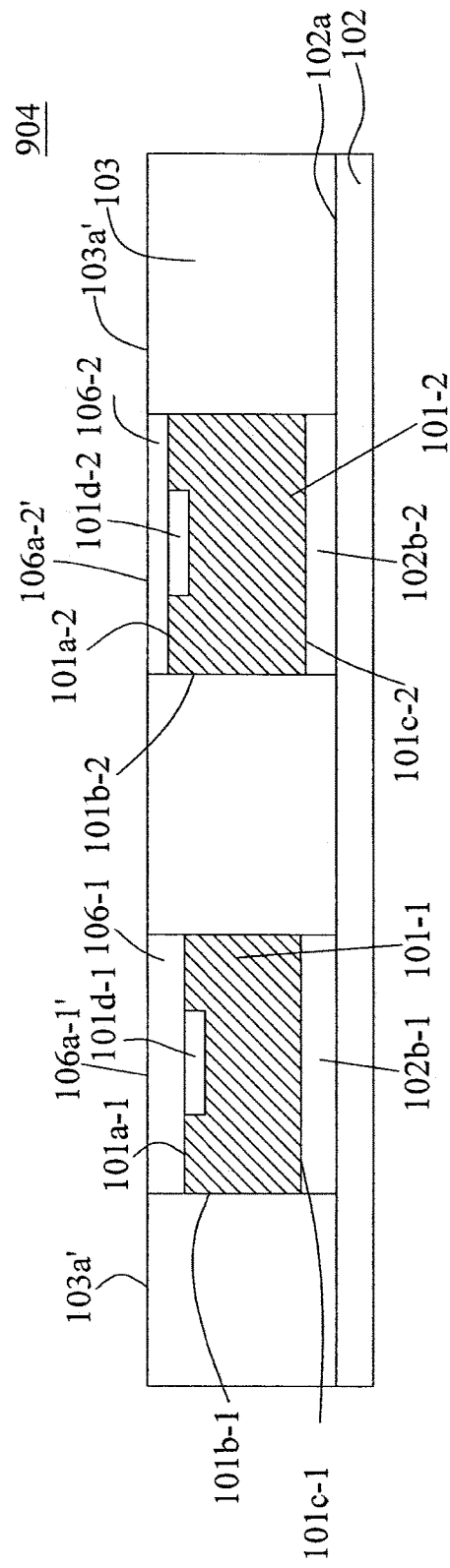
FIG. 9D is a schematic view of a ground molding and a ground sacrificial layer in accordance with some embodiments.

In operation 904, a first portion of molding 103, a portion of the first sacrificial layer 106-1 and a portion of the second sacrificial layer 106-2 are removed to expose a new first top surface 106a-1' and a new second top surface 106a-2' as in FIG. 9D. In some embodiments, the operation 904 is similar to the operation 803 as in FIG. 8D.

In some embodiments, the first portion of the molding 103, the portion of the first sacrificial layer 106-1 and the portion of the second sacrificial layer 106-2 are ground, such that the top surface 103a of the molding 103 becomes a new top surface 103a', and the first top surface 106a-1 becomes the new first top surface 106a-1', and the second top surface 106a-2 becomes the new second top surface 106a-2'. In some embodiments, the new top surface 103a' of the molding 103 is at a level substantially same as the new first top surface 106a-1' and the second top surface 106a-2'.

In some embodiments, the removed portion of the first sacrificial layer 106-1 is less than the removed portion of the second sacrificial layer 106-2. In some embodiments, a thickness of the ground first sacrificial layer 106-1 is greater than a thickness of the ground second sacrificial layer 106-2.

Figure 9E:
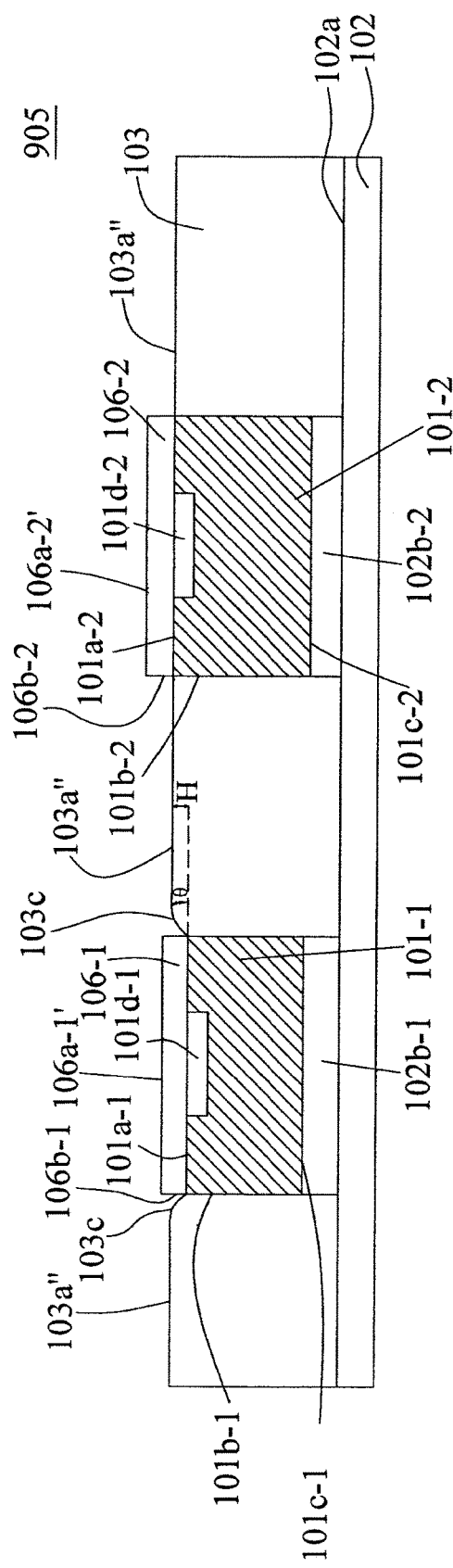
FIG. 9E is a schematic view of a top surface and a curved surface of a molding in accordance with some embodiments.

In operation 905, a second portion of the molding 103 is removed to expose a first sidewall 106b-1 of the first sacrificial layer 106-1 and a second sidewall 106b-2 of the second sacrificial layer 106-2 as in FIG. 9E. In some embodiments, the operation 905 is similar to the operation 805 as in FIG. 8E. In some embodiments, the new top surface 103a' of the molding 103 is removed by a plasma etching, such that the new top surface 103a' of the molding 103 becomes another new top surface 103a" of the molding 103 and a curved surface 103c of the molding 103. In some embodiments, the plasma etching operation includes connecting the substrate 102 to a grounded or powered electrode and exposing the molding 103 to a plasma including charged ions or neutral atoms. In some embodiments, the plasma chemically reacts with the molding 103 to form a volatile etch product, then the volatile etch product is removed from the molding 103, and thus the second portion of the molding 103 is removed upon the chemical reaction between the plasma and the molding 103.

In some embodiments, the plasma etching operation includes flowing a gas mixture including carbon tetrafluoride ($CF_4$), oxygen ($O_2$) and nitrogen ($N_2$) towards the molding 103. In some embodiments, $CF_4$ is flown in a rate of about 200 sccm (standard cubic centimeter per minute), $O_2$ is flown in a rate of about 400 sccm, and $N_2$ is flown in a rate of about 800 sccm. In some embodiments, the gas mixture is powered by a source with a power of about 500 Watt. In some embodiments, the plasma etching operation is performed under a temperature of about 70° C. In some embodiments, the plasma etching operation is performed under a pressure of about 75 Pascal. In some embodiments, the plasma etching operation takes about 20 seconds to remove the second portion of the molding 103.

In some embodiments, the curved surface 103c is formed adjacent to a periphery of the first top surface 101a-1 of the first die 101-1. In some embodiments, the new top surface 103a" is at a level substantially higher than the first top surface 101a-1 of the first die 101-1. In some embodiments, the new top surface 103a" is at a level substantially same as the second top surface 101a-2 of the second die 101-2. In some embodiments, the new top surface 103a" is in similar configuration as the first top surface 103a-1 and the second top surface 103a-2 of FIG. 5. In some embodiments, the curved surface 103c is in similar configuration as the curved surface 103c of FIG. 5.

In some embodiments, the second portion of the molding 103 is removed to reduce a height of the molding 103 from the top surface 101a of the die 101 to a height H of less than about 2.2 μm. In some embodiments, the curved surface 103c includes a curvature greater than zero after removing the second portion of the molding 103. In some embodiments, an angle θ of the curved surface 103c of the molding 103 relative to the top surface 101a of the die 101 is formed after removing the second portion of the molding 103.

In some embodiments, a surface roughness (Ra) of the molding 103 is increased after removing the second portion of the molding 103. In some embodiments, the surface roughness (Ra) of the new top surface 103a" or the curved surface 103c is increased and is greater than 0.07 μm.

Figure 9F:
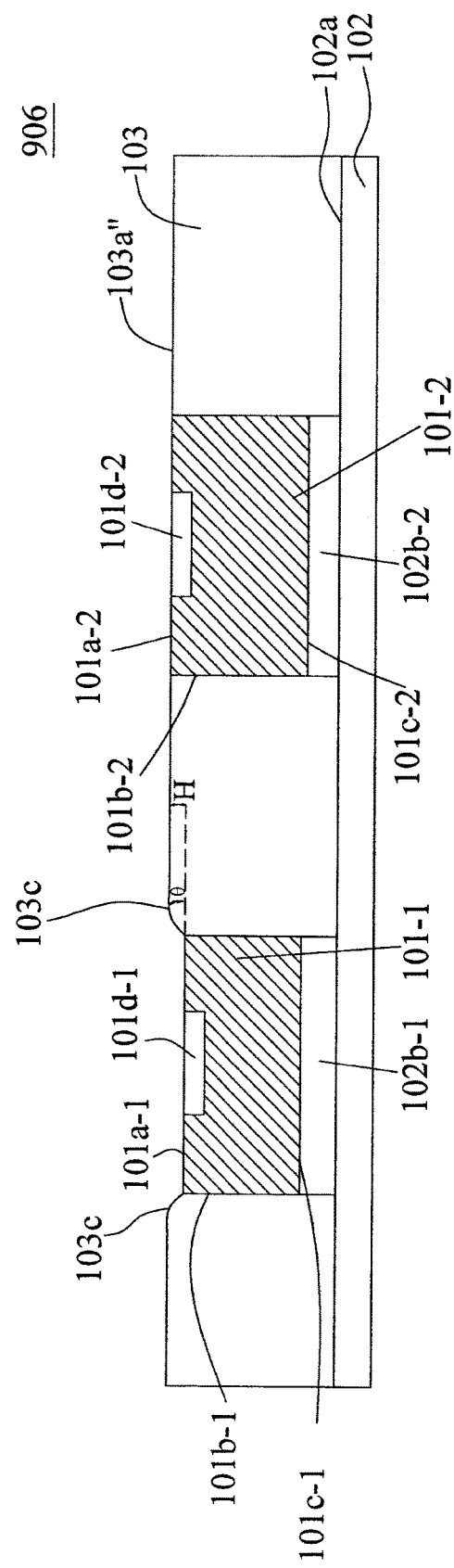
FIG. 9F is a schematic view of a first die and a second die without a sacrificial layer in accordance with some embodiments.

In operation 906, the first sacrificial layer 106-1 and the second sacrificial layer 106-2 are removed as in FIG. 9F. In some embodiments, the operation 906 is similar to the operation 806 as in FIG. 8F.

Figure 9G:
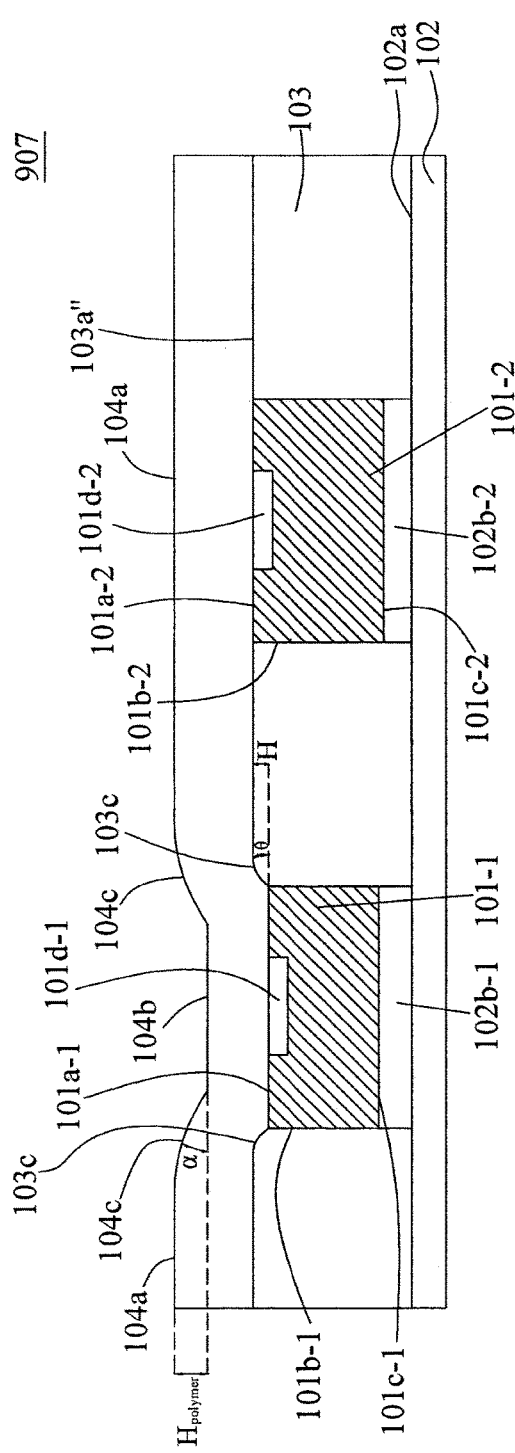
FIG. 9G is a schematic view of a polymer disposed over a first die and a second die in accordance with some embodiments.

In operation 907, a polymer 104 is disposed over the molding 103 as in FIG. 9G. In some embodiments, the operation 907 is similar to the operation 807 as in FIG. 8G. In some embodiments, the polymer 104 includes a first top surface 104a, a second top surface 104b and a curved surface 104c. In some embodiments, the first top surface 104a is at a level substantially higher than the second top surface 104b. In some embodiments, the first top surface 104a is coupled with the second top surface 104b by the curved surface 104c.

In some embodiments, there is a level difference $H_{polymer}$ between the first top surface 104a and the second top surface 104b of the polymer 104. In some embodiments, the level difference $H_{polymer}$ is disposed above the first die 101-1. In some embodiment, the level difference $H_{polymer}$ is substantially smaller than the level difference H between the first top surface 101a-1 of the first die 101-1 and the new top surface 103a" of the molding 103. In some embodiments, a height of the polymer 104 above the second die 101-2 is constant.

In some embodiments, the curved surface 104c has a curvature substantially smaller than the curvature of the curved surface 103c of the molding 103. In some embodiments, an angle α of the curved surface 104c of the polymer 104 relative to the second top surface 104b of the polymer 104 is substantially smaller than the angle θ of the curved surface 103c of the molding 103.

Figure 9H:
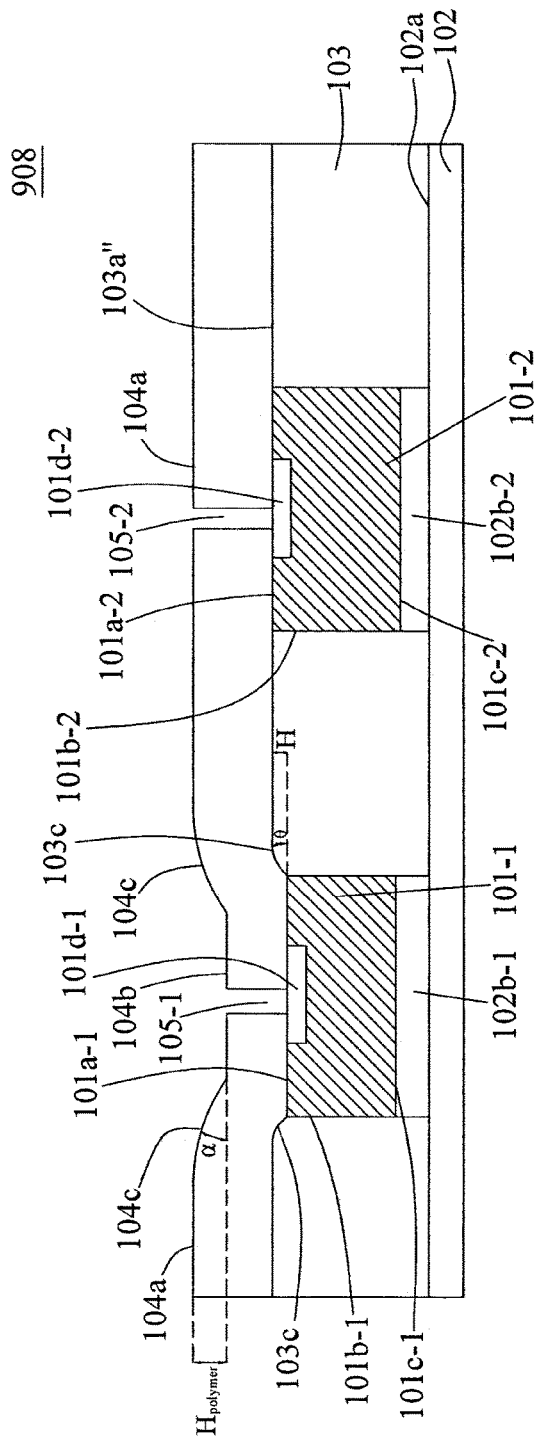
FIG. 9H is a schematic view of a first via and a second via passed through a polymer in accordance with some embodiments.

In operation 908, a first via 105-1 and a second via 105-2 are formed through the polymer 104 as in FIG. 9H. In some embodiments, the operation 908 is similar to the operation 808 as in FIG. 8H. In some embodiments, the first via 105-1 passes from the second top surface 104b to the first die pad 101d-1 through the polymer 104, and the second via 105-2 passes from the first top surface 104a to the second die pad 101d-2 through the polymer 104.

Figure 9I:
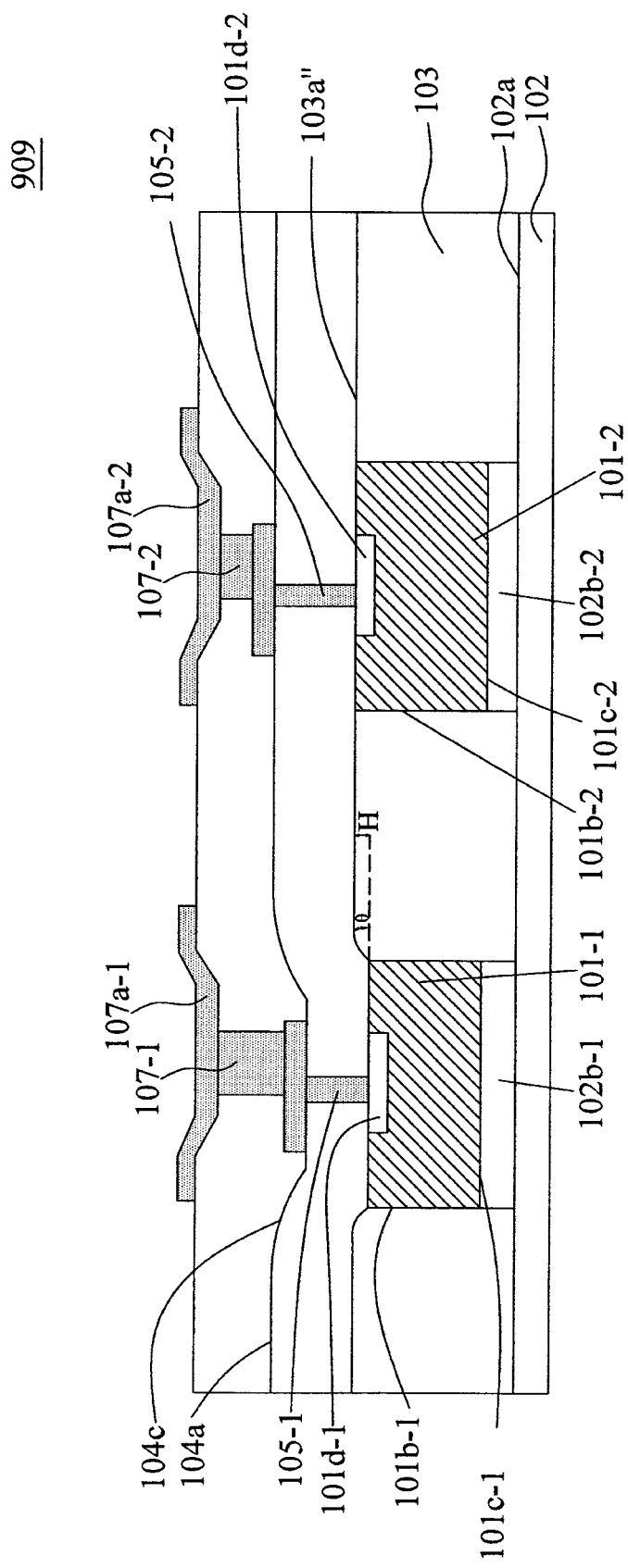
FIG. 9I is a schematic view of a redistribution layer (RDL) disposed over a first die and a second die in accordance with some embodiments.

In operation 909, a redistribution layer (RDL) 107-1 and 107-2 is formed as in FIG. 9I. In some embodiments, the operation 909 is similar to the operation 809 as in FIG. 8I. In some embodiments, the RDL 107 includes several conductive traces electrically connecting the first die pad 101d-1 and the second die pad 101d-2 with a first bond pad 107a-1 and a second bond pad 107a-2 through the first via 105-1 and the second via 105-2 respectively.

Figure 9J:
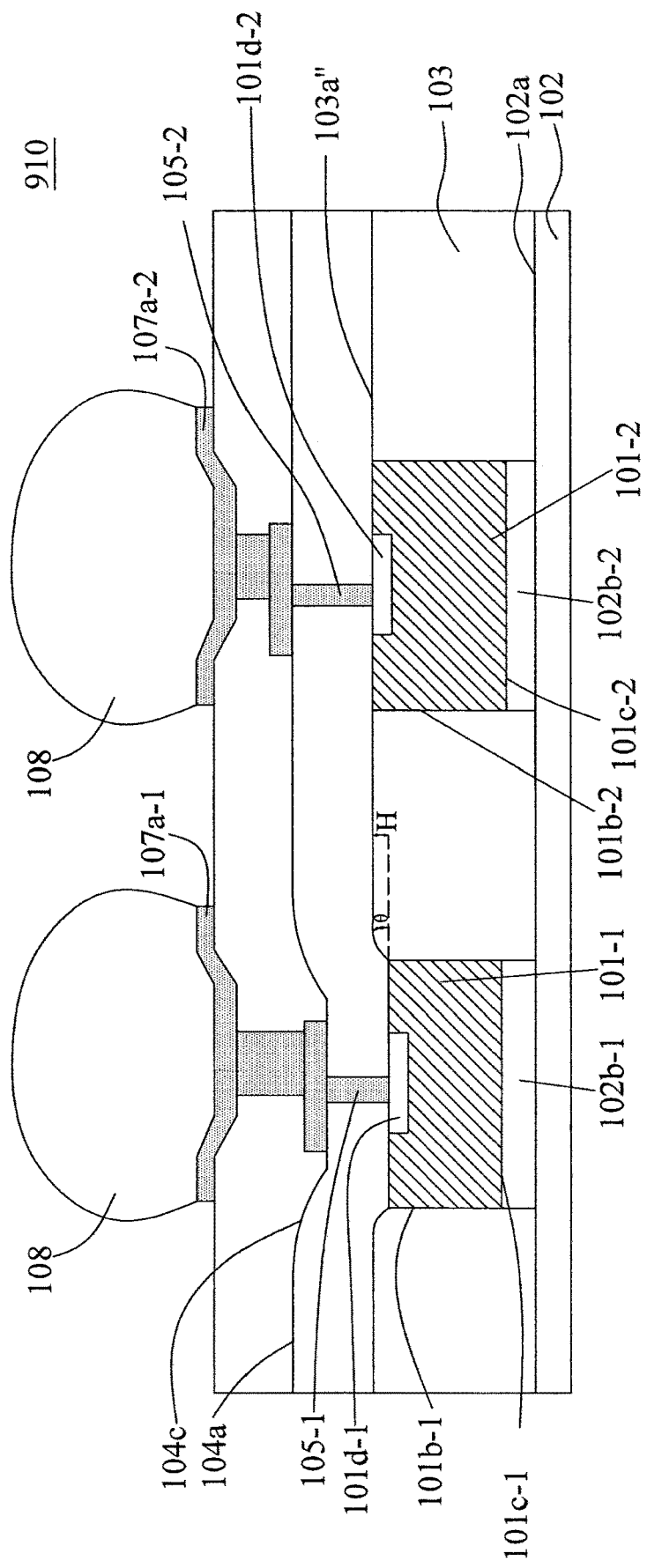
FIG. 9J is a schematic view of conductive bumps disposed on bond pads in accordance with some embodiments.

In operation 910, several conductive bumps 108 are disposed on the first bond pad 107a-1 and the second bond pad 107a-2 as in FIG. 9J. In some embodiments, the operation 910 is similar to the operation 810 as in FIG. 8J.

Figure 9K:
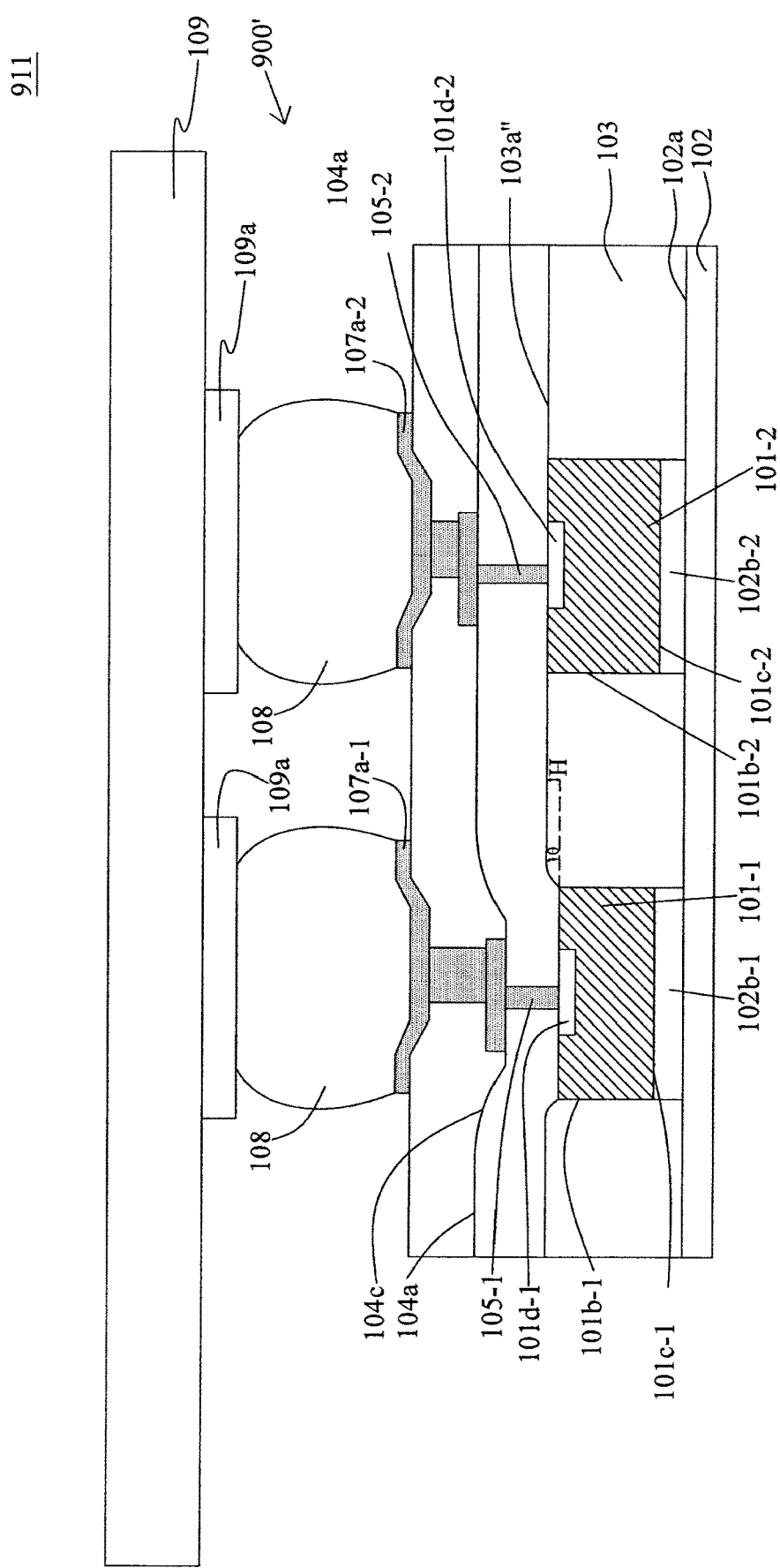
FIG. 9K is a schematic view of pads of another substrate bonded with conductive bumps in accordance with some embodiments.

In operation 911, the semiconductor structure 900' is bonded with another substrate 109 as in FIG. 9K. In some embodiments, the operation 911 is similar to the operation 811 as in FIG. 8K. In some embodiments, the conductive bump 108 is attached with a pad 109a disposed on another substrate 109, such that a circuitry of the first die 101-1 and a circuitry of the second die 101-2 are electrically connected with a circuitry of the substrate 109 through the first die pad 101d-1, the second die pad 101d-2, the first via 105-1, the second via 105-2, the RDL 107-1 and 107-2, the first bond pad 107a-1, the second bond pad 107a-2, the conductive bumps 108 and the pads 109a. In some embodiments, the semiconductor structure 900' is bonded with the substrate 109 to form a semiconductor package.

In the present disclosure, a semiconductor structure includes a molding with a curved surface adjacent to a periphery of a die. The curved surface is formed by a plasma etching operation. As a step height of the molding adjacent to the periphery of the die is reduced and the curved surface is formed by the plasma etching operation, a stepping of the molding adjacent to the periphery of the die is mitigated. Therefore, delamination of components is prevented.

In some embodiments, a method of manufacturing a semiconductor device includes receiving a die including a top surface, a die pad exposed from the top surface, and sacrificial layer covering the top surface and the die pad; disposing the die on a substrate, disposing a molding surrounding the die and covering the sacrificial layer; removing a first portion of the molding and a portion of the sacrificial layer to expose a top surface of the sacrificial layer; removing a second portion of the molding to expose a sidewall of the sacrificial layer; and removing the sacrificial layer from the die.

In some embodiments, the removing the second portion of the molding includes a plasma etching operation. In some embodiments, the removing the second portion of the molding includes forming a curved surface of the molding adjacent to a periphery of the top surface of the die and forming a top surface of the molding at a level substantially higher than the top surface of the die. In some embodiments, the removing the second portion of the molding includes forming a top surface of the molding at a level substantially same as the top surface of the die.

In some embodiments, the removing the second portion of the molding includes reducing a height of the molding to less than about 2.2 μm from the top surface of the die. In some embodiments, the removing the second portion of the molding includes increasing a surface roughness (Ra) of the molding greater than about 0.07 μm. In some embodiments, the removing the first portion of the molding and the portion of the sacrificial layer includes a grinding operation for reducing a thickness of the semiconductor structure. In some embodiments, the removing the sacrificial layer includes a wet etching operation. In some embodiments, the sacrificial layer includes polymer.

In some embodiments, a method of manufacturing a semiconductor structure includes receiving a die including a top surface and a sacrificial layer covering the top surface; disposing the die on a substrate; disposing a molding surrounding the die and exposing a top surface of the sacrificial layer; removing a portion of the molding to form a top surface and a curved surface, wherein a sidewall of the sacrificial layer is exposed from the top surface and the curved surface of the molding, and the curved surface of molding is adjacent to a periphery of the top surface of the die! removing the sacrificial layer from the die; and disposing a polymer over the die and the molding.

In some embodiments, the removing the portion of the molding includes a plasma etching operation. In some embodiments, the top surface of the molding is at a level substantially higher than or the same as the top surface of the die. In some embodiments, the polymer includes a first top surface, a second top surface and a curved surface, and the first top surface is coupled to the second surface by the curved surface. In some embodiments, a level difference between the first top surface and the second top surface of the polymer is substantially smaller than a level difference between the top surface of the die and the top surface of the molding.

In some embodiments, a method of manufacturing a semiconductor structure includes receiving a first die and a second die, the first die including a first sacrificial layer disposed thereon and the second die including a second sacrificial layer disposed thereon, wherein the first die includes a first height, the second die includes a second height, and the first height is different from the second height; disposing the first die and the second die on a substrate; disposing a molding surrounding the first die and the second die, a first top surface of the molding being at a level substantially same as a top surface of the first sacrificial layer and a top surface of the second sacrificial layer; removing a portion of the molding to expose a sidewall of the first sacrificial layer and a sidewall of the second sacrificial layer; and removing the first sacrificial layer from the first die and the second sacrificial layer from the second die.

In some embodiments, a thickness of the first sacrificial layer is different from a thickness of the second sacrificial layer before removing the portion of the molding.

In some embodiments, the disposing the molding surrounding the first die and the second die further includes: disposing the molding encapsulating the first died and the second die; and removing a portion of the molding, a portion of the first sacrificial layer and a portion of the second sacrificial layer to form the first top surface of the molding, the top surface of the first sacrificial layer, and the top surface of the second sacrificial layer.

In some embodiments, the removing the portion of the molding further forms a curved surface adjacent to a periphery of the top surface of the first die and a second top surface at a level substantially higher than the top surface of the first die. In some embodiments, the second top surface of the molding is at a level substantially same as the top surface of the second die. In some embodiments, the removing the portion of the molding comprises a plasma etching operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a die comprising a top surface, a die pad exposed from the top surface, and a sacrificial layer covering the top surface and the die pad;
   disposing the die on a substrate;
   disposing a molding surrounding the die and covering the sacrificial layer;
   removing a first portion of the molding and a portion of the sacrificial layer to expose a top surface of the sacrificial layer;
   removing a second portion of the molding to expose a sidewall of the sacrificial layer, wherein a top surface of the molding is at a level substantially same as the top surface of the die; and
   removing the sacrificial layer from the die.

2. The method of claim 1, wherein the removing the second portion of the molding comprises a plasma etching operation.

3. The method of claim 1, wherein the removing the second portion of the molding comprises increasing a surface roughness (Ra) of the molding greater than about 0.07 µm.

4. The method of claim 1, wherein the removing the first portion of the molding and the portion of the sacrificial layer comprises a grinding operation for reducing a thickness of the semiconductor structure.

5. The method of claim 1, wherein the removing the sacrificial layer comprises a wet etching operation.

6. The method of claim 1, wherein the sacrificial layer comprises polymer.

7. A method of manufacturing a semiconductor structure, comprising:
   receiving a die comprising a top surface and a sacrificial layer covering the top surface of the die, wherein the sacrificial layer comprises polymer materials;
   disposing the die on a substrate;
   disposing a molding surrounding the die and exposing a top surface of the sacrificial layer;
   removing a portion of the molding to form a top surface of the molding, wherein a sidewall of the sacrificial layer is exposed from the top surface of the molding;
   removing the sacrificial layer from the die; and
   disposing a polymer over the die and the molding, wherein the polymer has a first top surface over the molding and a second top surface over the die, the first top surface of the polymer is substantially parallel with the top surface of the molding, the second top surface of the polymer is substantially parallel with the top surface of the die, and the top surface of the molding is at a level substantially same as the top surface of the die.

8. The method of claim 7, wherein the removing the portion of the molding comprises a plasma etching operation.

9. The method of claim 7, wherein a level difference between the first top surface of the polymer and the second top surface of the polymer is substantially same as a level difference between the top surface of the die and the top surface of the molding.

10. The method of claim 7, wherein the removing of the portion of the molding comprises increasing a surface roughness (Ra) of the molding greater than about 0.07 µm.

11. The method of claim 10, further comprising forming a via in the polymer.

12. The method of claim 7, wherein the first top surface of the polymer is at a level substantially same as the second top surface of the polymer.

13. The method of claim 11, further comprising forming a redistribution layer electrically connected to the die through the via.

14. The method of claim 13, further comprising disposing a plurality of conductive bumps on the redistribution layer.

15. A method of manufacturing a semiconductor structure, comprising:
   receiving a first die and a second die, the first die comprising a first sacrificial layer disposed thereon and the second die comprising a second sacrificial layer disposed thereon, wherein the first die comprises a first height, the second die comprises a second height, and the first height is different from the second height;
   disposing the first die and the second die on a substrate;
   disposing a molding surrounding the first die and the second die, a first top surface of the molding being at a level substantially same as a top surface of the first sacrificial layer and a top surface of the second sacrificial layer;
   removing a first portion of the molding to expose a sidewall of the first sacrificial layer and a sidewall of the second sacrificial layer, wherein the removing the first portion of the molding further forms a curved surface adjacent to a periphery of a top surface of the first die and a second top surface of the molding at a level substantially higher than the top surface of the first die, wherein the second top surface of the molding is at a level substantially same as a top surface of the second die; and
   removing the first sacrificial layer from the first die and the second sacrificial layer from the second die.

16. The method of claim 15, wherein a thickness of the first sacrificial layer is different from a thickness of the second sacrificial layer before removing the first portion of the molding.

17. The method of claim 15, wherein the disposing the molding surrounding the first die and the second die further comprising:
   disposing the molding encapsulating the first die and the second die; and
   removing a second portion of the molding, a portion of the first sacrificial layer and a portion of the second sacrificial layer to form the first top surface of the molding, the top surface of the first sacrificial layer, and the top surface of the second sacrificial layer.

18. The method of claim 15, wherein the removing the first portion of the molding comprises a plasma etching operation.

19. The method of claim 15, wherein a portion of the first sacrificial layer and a portion of the second sacrificial layer are removed before removing the first portion of the molding.

20. The method of claim 19, wherein a removed portion of the first sacrificial layer is less than a removed portion of the second sacrificial layer.

* * * * *